United States Patent
Barringer et al.

(10) Patent No.: US 9,655,282 B2
(45) Date of Patent: May 16, 2017

(54) APPARATUS AND METHOD FOR ADJUSTING COOLANT FLOW RESISTANCE THROUGH LIQUID-COOLED ELECTRONICS RACK(S)

(71) Applicant: INTERNATIONAL BUSINESS MACHINES CORPORATION, Armonk, NY (US)

(72) Inventors: Wayne A. Barringer, Poughkeepsie, NY (US); David P. Graybill, Poughkeepsie, NY (US); Madhusudan K. Iyengar, Foster City, CA (US); Roger R. Schmidt, Poughkeepsie, NY (US); James J. Steffes, Poughkeepsie, NY (US); Gerard V. Weber, Jr., Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 579 days.

(21) Appl. No.: 14/265,820

(22) Filed: Apr. 30, 2014

(65) Prior Publication Data
US 2014/0231061 A1    Aug. 21, 2014

Related U.S. Application Data

(60) Continuation of application No. 13/795,010, filed on Mar. 12, 2013, now Pat. No. 9,386,727, which is a
(Continued)

(51) Int. Cl.
*G05D 15/00* (2006.01)
*H05K 7/20* (2006.01)

(52) U.S. Cl.
CPC ....... *H05K 7/20709* (2013.01); *H05K 7/2079* (2013.01); *H05K 7/20272* (2013.01);
(Continued)

(58) Field of Classification Search
CPC .. H05K 7/20; H05K 7/20209; H05K 7/20218; H05K 7/20272; H05K 7/20281;
(Continued)

(56) References Cited

U.S. PATENT DOCUMENTS 3,578,014 A    5/1971 Gachot
3,836,786 A    9/1974 Lowther
(Continued)

OTHER PUBLICATIONS

Barringer et al., Office Action for U.S. Appl. No. 13/795,010, filed Mar. 12, 2013 (U.S. Patent Publication No. 2013/0186612 A1), dated Jun. 16, 2015 (13 pages).
(Continued)

*Primary Examiner* — Travis Ruby
(74) *Attorney, Agent, or Firm* — Margaret A. McNamara, Esq.; Kevin P. Radigan, Esq.; Heslin Rothenberg Farley & Mesiti P.C.

(57) ABSTRACT

A method is presented for adjusting coolant flow resistance through one or more liquid-cooled electronics racks. Flow restrictors are employed in association with multiple heat exchange tube sections of a heat exchange assembly, or in association with a plurality of coolant supply lines or coolant return lines feeding multiple heat exchange assemblies. Flow restrictors associated with respective heat exchange tube sections (or respective heat exchange assemblies) are disposed at the coolant channel inlet or coolant channel outlet of the tube sections (or of the heat exchange assemblies). These flow restrictors tailor coolant flow resistance through the heat exchange tube sections or through the heat exchange assemblies to enhance overall heat transfer within the tube sections or across heat exchange assemblies by tailoring coolant flow. In one embodiment, the flow restrictors tailor a coolant flow distribution differential across multiple heat exchange tube sections or across multiple heat exchange assemblies.

10 Claims, 17 Drawing Sheets

Related U.S. Application Data division of application No. 12/556,040, filed on Sep. 9, 2009, now abandoned.

(52) U.S. Cl.
CPC ..... H05K 7/20281 (2013.01); H05K 7/20736 (2013.01); H05K 7/20763 (2013.01)

(58) Field of Classification Search
CPC ............. H05K 7/2029; H05K 7/20354; H05K 7/20572; H05K 7/20636; H05K 7/20645; H05K 7/207; H05K 7/20709; H05K 7/20772; H05K 7/20736; H05K 7/20763; H05K 7/2079; H05K 7/20781; H05K 7/20836; H05K 5/00; F25B 41/06; F25B 2313/0233; F25B 2600/25; F25B 2600/2511; F25B 2600/2515; F25B 2700/197
USPC ............ 165/279; 361/679.54, 389, 396, 699, 361/701, 698, 702, 679.53; 312/236; 62/259.2, 185, 201, 332, 333
See application file for complete search history.

(56) References Cited

U.S. PATENT DOCUMENTS

| | | |
|---|---|---|
| 3,859,166 A | 1/1975 | Flynn et al. |
| 4,325,296 A | 4/1982 | Ukai et al. |
| 4,430,866 A | 2/1984 | Willitts |
| 4,664,877 A | 5/1987 | Magee et al. |
| 4,707,324 A | 11/1987 | Storrick |
| 5,116,207 A | 5/1992 | Doolittle et al. |
| 5,385,202 A | 1/1995 | Drosdziok et al. |
| 5,491,649 A | 2/1996 | Friday et al. |
| 5,634,350 A | 6/1997 | De Medio |
| 5,782,101 A | 7/1998 | Dennis |
| 5,829,264 A | 11/1998 | Ishigaki et al. |
| 5,859,885 A | 1/1999 | Rusnica et al. |
| 5,881,801 A | 3/1999 | Hayakawa et al. |
| 5,937,661 A | 8/1999 | Kishimoto et al. |
| 6,212,895 B1 | 4/2001 | Richardson |
| 6,574,104 B2 | 6/2003 | Patel et al. |
| 6,866,092 B1 | 3/2005 | Molivadas |
| 6,973,793 B2 | 12/2005 | Douglas et al. |
| 7,012,807 B2 | 3/2006 | Chu et al. |
| 7,032,611 B1 | 4/2006 | Sheng |
| 7,088,585 B2 | 8/2006 | Chu et al. |
| 7,096,679 B2 | 8/2006 | Manole |
| 7,106,590 B2 | 9/2006 | Chu et al. |
| 7,143,605 B2 | 12/2006 | Rohrer et al. |
| 7,191,954 B2 | 3/2007 | Kline |
| 7,222,502 B2 | 5/2007 | Kobayashi et al. |
| 7,309,209 B2 | 12/2007 | Amiot et al. |
| 7,315,448 B1 | 1/2008 | Bash et al. |
| 7,349,213 B2 | 3/2008 | Campbell et al. |
| 7,365,973 B2 | 4/2008 | Rasmussen et al. |
| 7,385,810 B2 | 6/2008 | Chu et al. |
| 7,392,823 B2 | 7/2008 | Dong et al. |
| 7,415,835 B2 | 8/2008 | Cowans et al. |
| 7,418,825 B1 | 9/2008 | Bean, Jr. |
| 7,420,808 B2 | 9/2008 | Campbell et al. |
| 7,477,514 B2 | 1/2009 | Campbell et al. |
| 7,531,142 B2 | 5/2009 | Huziwara et al. |
| 7,559,207 B2 | 7/2009 | Knight et al. |
| 7,715,194 B2 | 5/2010 | Brewer et al. |
| 7,810,679 B2 | 10/2010 | Wauters et al. |
| 7,895,854 B2 | 3/2011 | Bash et al. |
| 7,903,409 B2 | 3/2011 | Patel et al. |
| 7,944,694 B2 | 5/2011 | Campbell et al. |
| 7,961,475 B2 | 6/2011 | Campbell et al. |
| 7,963,119 B2 | 6/2011 | Campbell et al. |
| 8,018,718 B2 | 9/2011 | Goth et al. |
| 8,018,720 B2 | 9/2011 | Campbell et al. |
| 8,208,258 B2 | 6/2012 | Campbell et al. |
| 8,322,154 B2 | 12/2012 | Campbell et al. |
| 8,583,290 B2 | 11/2013 | Campbell et al. |
| 2001/0042571 A1 | 11/2001 | Fang et al. |
| 2002/0149909 A1 | 10/2002 | Konstad et al. |
| 2003/0057546 A1 | 3/2003 | Memory et al. |
| 2005/0115257 A1 | 6/2005 | Goth et al. |
| 2005/0244280 A1 | 11/2005 | Malone et al. |
| 2006/0126296 A1 | 6/2006 | Campbell et al. |
| 2006/0180300 A1 | 8/2006 | Lenehan et al. |
| 2007/0119570 A1 | 5/2007 | Kuo et al. |
| 2007/0213881 A1 | 9/2007 | Belady et al. |
| 2007/0297136 A1 | 12/2007 | Konshak |
| 2008/0205003 A1 | 8/2008 | Belady |
| 2009/0080173 A1 | 3/2009 | Schmidt et al. |
| 2009/0126909 A1 | 5/2009 | Ellsworth, Jr. et al. |
| 2009/0126910 A1 | 5/2009 | Campbell et al. |
| 2009/0133866 A1 | 5/2009 | Campbell et al. |
| 2010/0032142 A1 | 2/2010 | Copeland et al. |
| 2010/0263855 A1 | 10/2010 | Arimilli et al. |
| 2011/0029152 A1 | 2/2011 | Patel et al. |
| 2011/0056225 A1 | 3/2011 | Campbell et al. |
| 2011/0056674 A1 | 3/2011 | Campbell et al. |
| 2011/0056675 A1 | 3/2011 | Barringer et al. |
| 2011/0058637 A1 | 3/2011 | Campbell et al. |
| 2011/0060470 A1 | 3/2011 | Campbell et al. |
| 2012/0201005 A1 | 8/2012 | Barringer et al. |
| 2013/0180686 A1 | 7/2013 | Campbell et al. |
| 2013/0186612 A1 | 7/2013 | Barringer et al. |

OTHER PUBLICATIONS

Campbell et al., Office Action for U.S. Appl. No. 13/785,275, filed Mar. 5, 2013 (U.S. Patent Publication No. 2013/0180686 A1), dated Apr. 20, 2013 (10 pages).

Zamanabadi et al., "Hybrid Control Challenges in Refrigeration Systems", Danfoss A/S, Denmark, Advanced Engineering-Refrigeration and Air Conditioning, EECI (2007) (39 pages).

Campbell et al., Office Action for U.S. Appl. No. 12/556,019, filed Sep. 9, 2009 (U.S. Patent Publication No. 2011/0058637 A1), dated Nov. 2, 2012 (28 pages).

Campbell et al., Notice of Allowance for U.S. Appl. No. 12/556,031, filed Sep. 9, 2009 (U.S. Patent Publication No. 2011/0056225 A1), dated Jul. 24, 2012 (25 pages).

Campbell et al., Office Action for U.S. Appl. No. 12/556,053, filed Sep. 9, 2009 (U.S. Patent Publication No. 2011/0056674 A1) dated Dec. 21, 2011 (19 pages).

Campbell et al., Notice of Allowance for U.S. Appl. No. 12/556,053, filed Sep. 9, 2009 (U.S. Patent Publication No. 2011/0056674 A1), dated Feb. 16, 2012 (5 pages).

Campbell et al., Office Action for U.S. Appl. No. 12/556,066 (U.S. Patent Publication No. 2011/0060470 A1), dated Aug. 31, 2011 (35 pages).

Campbell et al., Office Action for U.S. Appl. No. 12/556,066, filed Sep. 9, 2009 (U.S. Patent Publication No. 2011/0060470 A1), dated Mar. 22, 2012 (52 pages).

Campbell et al., Office Action for U.S. Appl. No. 12/556,066, filed Sep. 9, 2009 (U.S. Patent Publication No. 2011/0060470 A1), dated Aug. 27, 2012 (44 pages).

Barringer et al., Office Action for U.S. Appl. No. 13/447,457, filed Apr. 16, 2012 (U.S. Patent Publication No. 2012/0201005 A1), dated Apr. 15, 2013 (26 pages).

Campbell et al., Office Action for U.S. Appl. No. 12/556,019, filed Sep. 9, 2009 (U.S. Patent Publication No. 2011/0058637 A1), dated May 23, 2013 (29 pages).

Campbell et al., Notice of Allowance for U.S. Appl. No. 12/556,066, filed Sep. 9, 2009 (U.S. Patent Publication No. 2011/0060470 A1), dated Jul. 3, 2013 (41 pages).

Thirakomen, Kecha "Stabilizing Chilled Water Distribution", Ashraei Thailand Chapter Journal 2007-2009, vol. 2, "httep:222/ashraethailand.org/download/ashraethailand_org/journal_2007-2008_40_stabilizing%chilled%20water%20distribution.pdf" (5 pages).

Barringer et al., Office Action for U.S. Appl. No. 12/556,040, filed Sep. 9, 2009 (U.S. Patent Publication No. 2011/0056675 A1), dated Sep. 26, 2013 (21 pages).

(56) References Cited

OTHER PUBLICATIONS

Barringer et al., Office Action for U.S. Appl. No. 13/447,457, filed Apr. 16, 2012 (U.S. Patent Publication No. 2012/0201005 A1), dated Nov. 7, 2013 (25 pages).
Campbell et al., Office Action for U.S. Appl. No. 12/556,019, filed Sep. 9, 2009 (U.S. Patent Publication No. 2011/0058637 A1), dated Dec. 4, 2013 (17 pages).
FAS Military Analysis Network, "Nuclear Propulsion", Feb. 29, 2000 (8 pages).
Campbell et al., Office Action for U.S. Appl. No. 12/556,019, filed Sep. 9, 2009 (U.S. Patent Publication No. 2011/0058637 A1), dated Apr. 14, 2014 (17 pages).

APPARATUS AND METHOD FOR ADJUSTING COOLANT FLOW RESISTANCE THROUGH LIQUID-COOLED ELECTRONICS RACK(S)

BACKGROUND

The present invention relates in general to a method and apparatus for adjusting coolant flow resistance within one or more liquid-cooled electronics racks or between multiple electronics racks.

The power dissipation of integrated circuit chips, and the modules containing the chips, continues to increase in order to achieve increases in processor performance. This trend poses a cooling challenge at both module and system level. Increased airflow rates are needed to effectively cool high power modules and to limit the temperature of the air that is exhausted into the computer center.

In many large server applications, processors along with their associated electronics (e.g., memory, disk drives, power supplies, etc.) are packaged in removable drawer configurations stacked within a rack or frame. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer by providing greater airflow, through the use of a more powerful air moving device or by increasing the rotational speed (i.e., RPMs) of an existing air moving device. However, this approach is becoming problematic at the rack level in the context of a computer installation (i.e., data center).

The sensible heat load carried by the air exiting the rack is stressing the availability of the room air-conditioning to effectively handle the load. This is especially true for large installations with "server farms" or large banks of computer racks close together. In such installations, liquid cooling (e.g., water or refrigerant cooling) is an attractive technology to manage the higher heat fluxes. The liquid absorbs the heat dissipated by the components/modules in an efficient manner. Typically, the heat is ultimately transferred from the liquid to an outside environment, whether air or liquid cooled.

BRIEF SUMMARY

In one aspect, a method of cooling a plurality of electronics racks is provided, each electronics rack including a heat exchange assembly. The method includes: obtaining a cooling apparatus comprising: a plurality of coolant supply lines and a plurality of coolant return lines coupled in fluid communication between a coolant distribution unit and the heat exchange assemblies of the plurality of electronics racks, the coolant distribution unit supplying cooled system coolant for the heat exchange assemblies, wherein when operational, system coolant circulates in a closed loop between the coolant distribution unit and the heat exchange assemblies via, at least in part, the plurality of coolant supply lines and the plurality of coolant return lines; and a plurality of rack flow restrictors associated with at least one of the plurality of coolant supply lines, the plurality of coolant return lines, or the heat exchange assemblies of the plurality of electronics racks, each rack flow restrictor being associated with a respective coolant supply line of the plurality of coolant supply lines, a respective coolant return line of the plurality of coolant return lines, or a respective heat exchange assembly of the heat exchange assemblies, for tailoring coolant flow resistance through the heat exchange assembly of the respective electronics rack, and wherein the plurality of rack flow restrictors tailor coolant flow resistance through at least one of the plurality of coolant supply lines, the plurality of coolant return lines, or the heat exchange assemblies, to enhance overall heat transfer through the heat exchange assemblies of the plurality of electronics racks. Additionally, the method includes cooling the plurality of electronics racks, the cooling including: collecting rack power utilization data for each electronics rack of the plurality of electronics racks; summing the rack power utilizations of the plurality of electronics racks and determining a total coolant flow required to cool the plurality of electronics racks, and based on the total coolant flow required, automatically setting a rate of cooled system coolant supplied by the coolant distribution unit; determining the highest power-utilizing electronics rack of the plurality of electronics racks and automatically setting the rack flow restrictor associated therewith to full open position; ascertaining coolant pressure and temperature information at the heat exchange assemblies of the plurality of electronics racks; and setting rack flow restrictors associated with the remaining electronics racks of the plurality of electronics racks to ensure coolant exhausting from the heat exchange assemblies of the remaining electronics racks is in a superheated vapor state within a specified range of superheated temperatures based on the collected coolant pressure and temperature information.

In another aspect, a method of cooling an electronics rack comprising a heat exchange assembly with a plurality of heat exchange tube sections is provided. The method includes providing a cooling apparatus which includes: multiple temperature sensors and multiple pressure sensors, each associated with a respective heat exchange tube section of the heat exchange assembly for monitoring temperature and pressure of coolant passing therethrough; multiple flow restrictors associated with the plurality of heat exchange tube sections, each flow restrictor of the multiple flow restrictors being associated with a respective heat exchange tube section of the plurality of heat exchange tube sections for tailoring coolant flow resistance through the respective heat exchange tube section based, at least in part, on pressure and temperature of coolant passing through the respective heat exchange tube section; and a rack control unit configured to control coolant flow through the multiple heat exchange tube sections of the heat exchange assembly. The rack control unit is configured to: collect rack section power utilization data for a plurality of rack sections of the electronics rack, each rack section having an associated heat exchange tube section of the plurality of heat exchange tube sections; determine a highest power-utilizing rack section within the electronics rack, and set the flow restrictor of the associated heat exchange tube section of that rack section to full open position; and set flow restrictors associated with the remaining heat exchange tube sections of the heat exchange assembly to ensure coolant exhausting from the remaining heat exchange tube section is in superheated vapor state within a specified range of superheated temperatures based on the collected coolant pressures and temperatures.

Further, additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
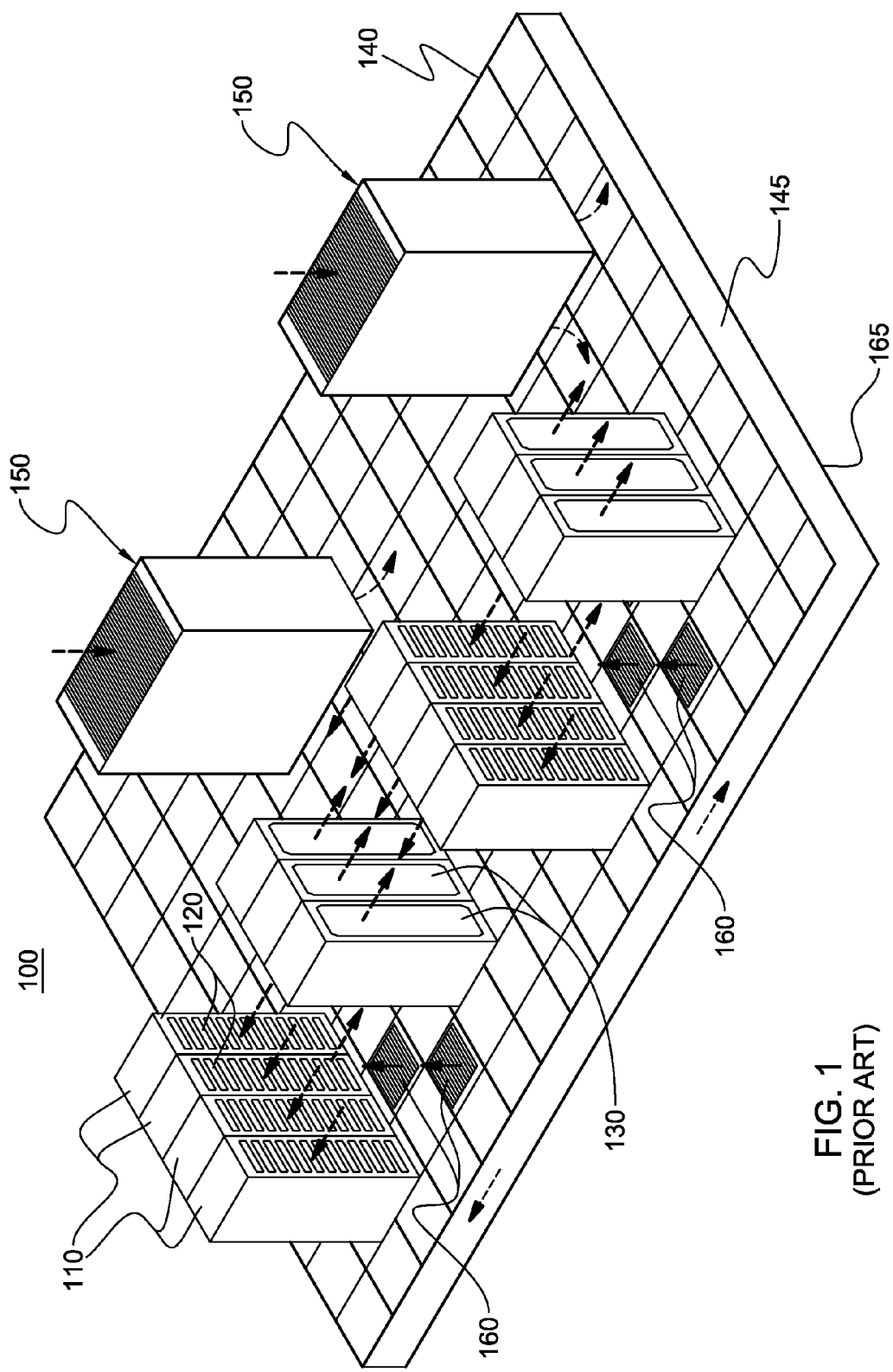
FIG. 1 depicts one embodiment of a conventional raised floor layout of an air-cooled data center.

As used herein, the terms "electronics rack", "rack-mounted electronic equipment", and "rack unit" are used interchangeably, and unless otherwise specified include any housing, frame, rack, compartment, blade server system, etc., having one or more heat generating components of a computer system or electronics system, and may be, for example, a stand-alone computer processor having high, mid or low end processing capability. In one embodiment, an electronics rack may comprise multiple electronics subsystems, each having one or more heat generating components disposed therein requiring cooling. "Electronics subsystem" refers to any sub-housing, blade, book, drawer, node, compartment, etc., having one or more heat generating electronic components disposed therein. Each electronics subsystem of an electronics rack may be movable or fixed relative to the electronics rack, with the rack-mounted electronics drawers of a multi-drawer rack unit and blades of a blade center system being two examples of subsystems of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies and memory support dies. As a further example, the electronic component may comprise one or more bare dies or one or more packaged dies disposed on a common carrier. As used herein, "primary heat generating component" refers to a primary heat generating electronic component within an electronics subsystem, while "secondary heat generating component" refers to an electronic component of the electronics subsystem generating less heat than the primary heat generating component to be cooled. "Primary heat generating die" refers, for example, to a primary heat generating die or chip within a heat generating electronic component comprising primary and secondary heat generating dies (with a processor die being one example). "Secondary heat generating die" refers to a die of a multi-die electronic component generating less heat than the primary heat generating die thereof (with memory dies and memory support dies being examples of secondary dies to be cooled). As one example, a heat generating electronic component could comprise multiple primary heat generating bare dies and multiple secondary heat generating dies on a common carrier. Further, unless otherwise specified herein, the term "liquid-cooled cold plate" refers to any conventional thermally conductive structure having a plurality of channels or passageways formed therein for flowing of liquid coolant therethrough. In addition, "metallurgically bonded" refers generally herein to two components being welded, brazed or soldered together by any means.

As used herein, "air-to-liquid heat exchange assembly" means any heat exchange mechanism characterized as described herein through which liquid coolant can circulate; and includes, one or more discrete air-to-liquid heat exchangers coupled either in series or in parallel. An air-to-liquid heat exchanger may comprise, for example, one or more coolant flow paths, formed of thermally conductive tubing (such as copper or other tubing) in thermal or mechanical contact with a plurality of air-cooled cooling fins. Size, configuration and construction of the air-to-liquid heat exchange assembly and/or air-to-liquid heat exchanger thereof can vary without departing from the scope of the invention disclosed herein. A "liquid-to-liquid heat exchanger" may comprise, for example, two or more coolant flow paths, formed of thermally conductive tubing (such as copper or other tubing) in thermal communication with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of the coolants may comprise a brine, a fluorocarbon liquid, a liquid metal, or other similar coolant, or refrigerant, while still maintaining the advantages and unique features of the present invention. As a specific example, the concepts described hereinbelow with reference to FIGS. 8-18 employ water as facility coolant and a refrigerant as system coolant.

Reference is made below to the drawings (which are not drawn to scale to facilitate understanding of the invention), wherein the same reference numbers used throughout different figures designate the same or similar components.

As shown in FIG. 1, in a raised floor layout of an air cooled computer installation or data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet airflow to cool the electronic components within the drawer(s) of the rack. The supply air plenum 145 provides conditioned and cooled air to the air-inlet sides of the electronics racks via perforated floor tiles 160 disposed in a "cold" air aisle of the data center. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" air aisles of the data center defined by opposing air outlet sides 130 of the electronics racks 110.

Figure 2:
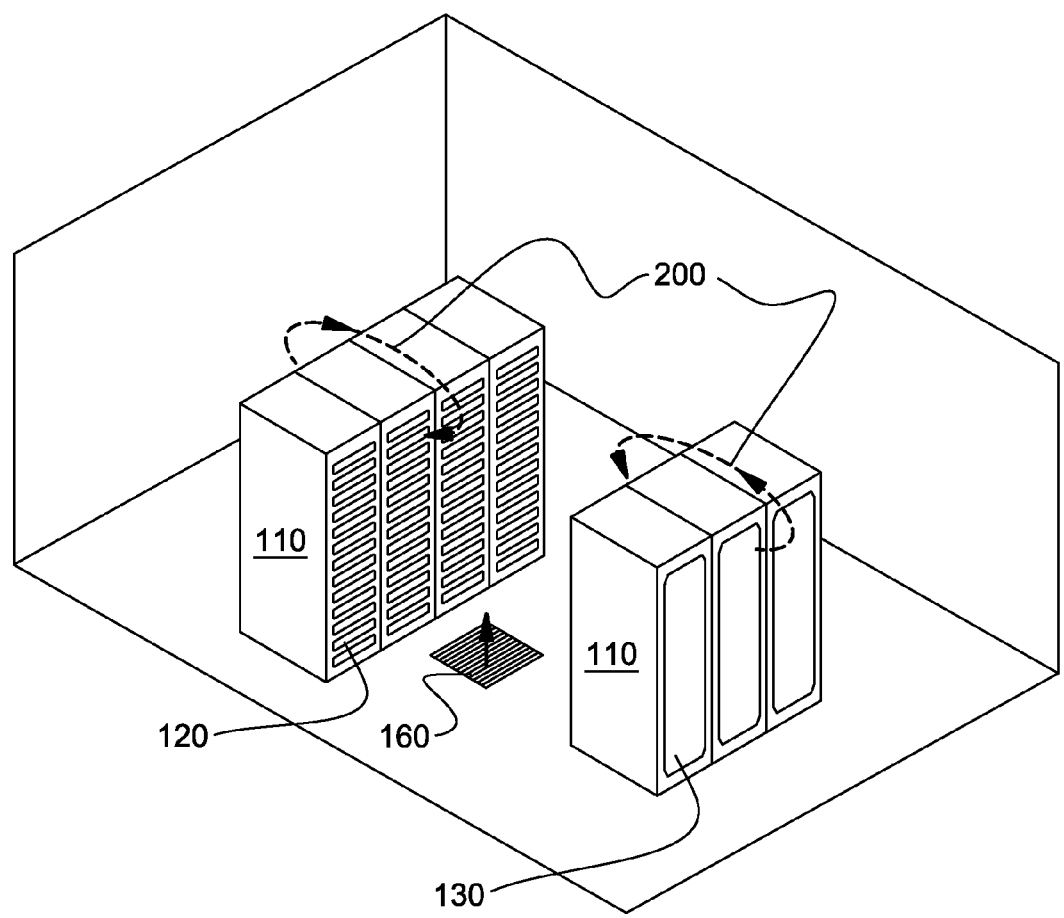
FIG. 2 depicts one problem addressed by the present invention, showing recirculation of airflow patterns in one implementation of a raised floor layout of an air-cooled data center.

Due to the ever increasing airflow requirements through electronics racks, and limits of air distribution within the typical computer room installation, recirculation problems within the room may occur. This is shown in FIG. 2 for a raised floor layout, wherein hot air recirculation 200 occurs from the air outlet sides 130 of the electronics racks back to the cold air aisle defined by the opposing air inlet sides 120 of the electronics rack. This recirculation can occur because the conditioned air supplied through tiles 160 is typically only a fraction of the airflow rate forced through the electronics racks by the air moving devices disposed therein. This can be due, for example, to limitations on the tile sizes (or diffuser flow rates). The remaining fraction of the supply of inlet side air is often made up by ambient room air through recirculation 200. This re-circulating flow is often very complex in nature, and can lead to significantly higher rack unit inlet temperatures than might be expected.

The recirculation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 18-35° C. range. For a raised floor layout such as depicted in FIG. 1, however, temperatures can range from 15-20° C. at the lower portion of the rack, close to the cooled air input floor vents, to as much as 45-50° C. at the upper portion of the electronics rack, where the hot air can form a self-sustaining recirculation loop. Since the allowable rack heat load is limited by the rack inlet air temperature at the "hot" part, this temperature distribution correlates to an inefficient utilization of available air conditioning capability. Computer installation equipment almost always represents a high capital investment to the customer. Thus, it is of significant importance, from a product reliability and performance view point, and from a customer satisfaction and business perspective, to achieve a substantially uniform temperature across the air inlet side of the rack unit. The efficient cooling of such computer and electronic systems, and the amelioration of localized hot air inlet temperatures to one or more rack units due to recirculation of air currents, are addressed by the apparatuses and methods disclosed herein.

Figure 3:
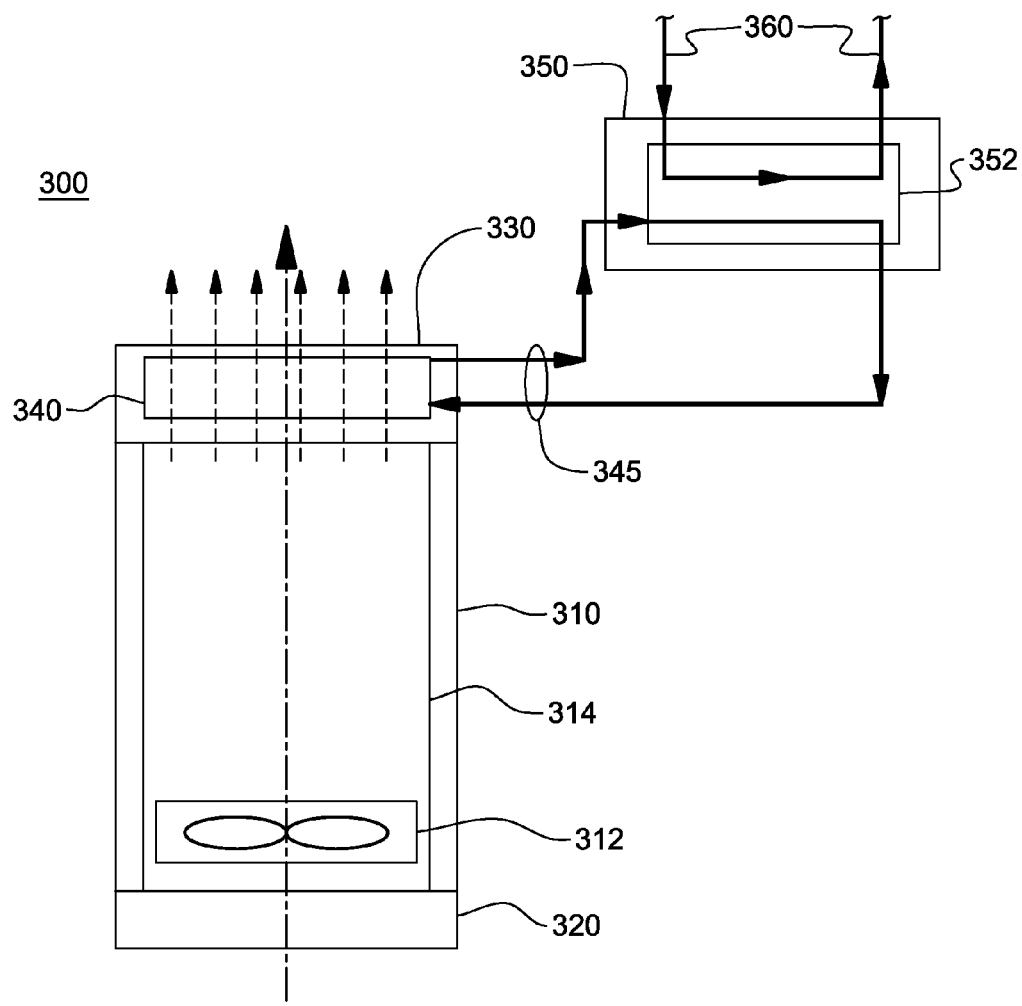
FIG. 3 is a top plan view of one embodiment of an electronics rack with an air-to-liquid heat exchanger mounted to an outlet door thereof, in accordance with one aspect of the present invention.

FIG. 3 depicts one embodiment of a cooled electronics system, generally denoted 300, in accordance with an aspect of the present invention. In this embodiment, electronics system 300 includes an electronics rack 310 having an inlet door 320 and an outlet door 330, which respectively have openings to allow for the ingress and egress of external air, respectively, through the air inlet side and air outlet side of electronics rack 310. The system further includes at least one air-moving device 312 for moving external air across at least one electronics subsystem 314 positioned within the electronics rack. Disposed within outlet door 330 is an air-to-liquid heat exchanger 340 across which the inlet-to-outlet airflow through the electronics rack passes. A cooling unit 350 is used to buffer the air-to-liquid heat exchanger from facility coolant 360, for example, provided via a computer room water-conditioning unit (not shown). Air-to-liquid heat exchanger 340 removes heat from the exhausted inlet-to-outlet airflow through the electronics rack via the system coolant, for ultimate transfer in cooling unit 350 to facility coolant 360 via liquid-to-liquid heat exchanger 352 disposed therein. This cooling apparatus advantageously reduces heat load on existing air-conditioning units within the data center, and facilitates cooling of electronics racks by cooling the air egressing from the electronics rack and thus cooling any air re-circulating to the air inlet side thereof As shown in FIG. 3, a system coolant loop 345 couples air-to-liquid heat exchanger 340 to cooling unit 350. In one embodiment, the system coolant employed is water. By way of example, such a system is described in U.S. Pat. No. 7,385,810 B2, issued Jun. 10, 2008, and entitled "Apparatus and Method for Facilitating Cooling of an Electronics Rack Employing a Heat Exchange Assembly Mounted to an Outlet Door Cover of the Electronics Rack".

In this co-pending application, the inlet and outlet plenums mount within the door and are coupled to supply and return manifolds disposed beneath a raised floor. Presented hereinbelow are enhanced variations on such an outlet door heat exchanger. Specifically, disclosed hereinbelow is an air-to-liquid heat exchanger which employs a pumped refrigerant as the system coolant. Connection hoses for the pumped refrigerant system are, in one embodiment, metal braided hoses, and the system coolant supply and return headers for the pumped refrigerant system are mounted overhead relative to the electronics racks within the data center. Thus, for the pumped refrigerant system described below, system coolant enters and exits the respective system coolant inlet and outlet plenums at the top of the door and rack. Further, because pumped refrigerant is employed, the hose and couplings used in the pumped refrigerant systems described below are affixed at both ends, i.e., to the system coolant plenums on one end and to the overhead supply and return headers on the other end.

Figure 4:
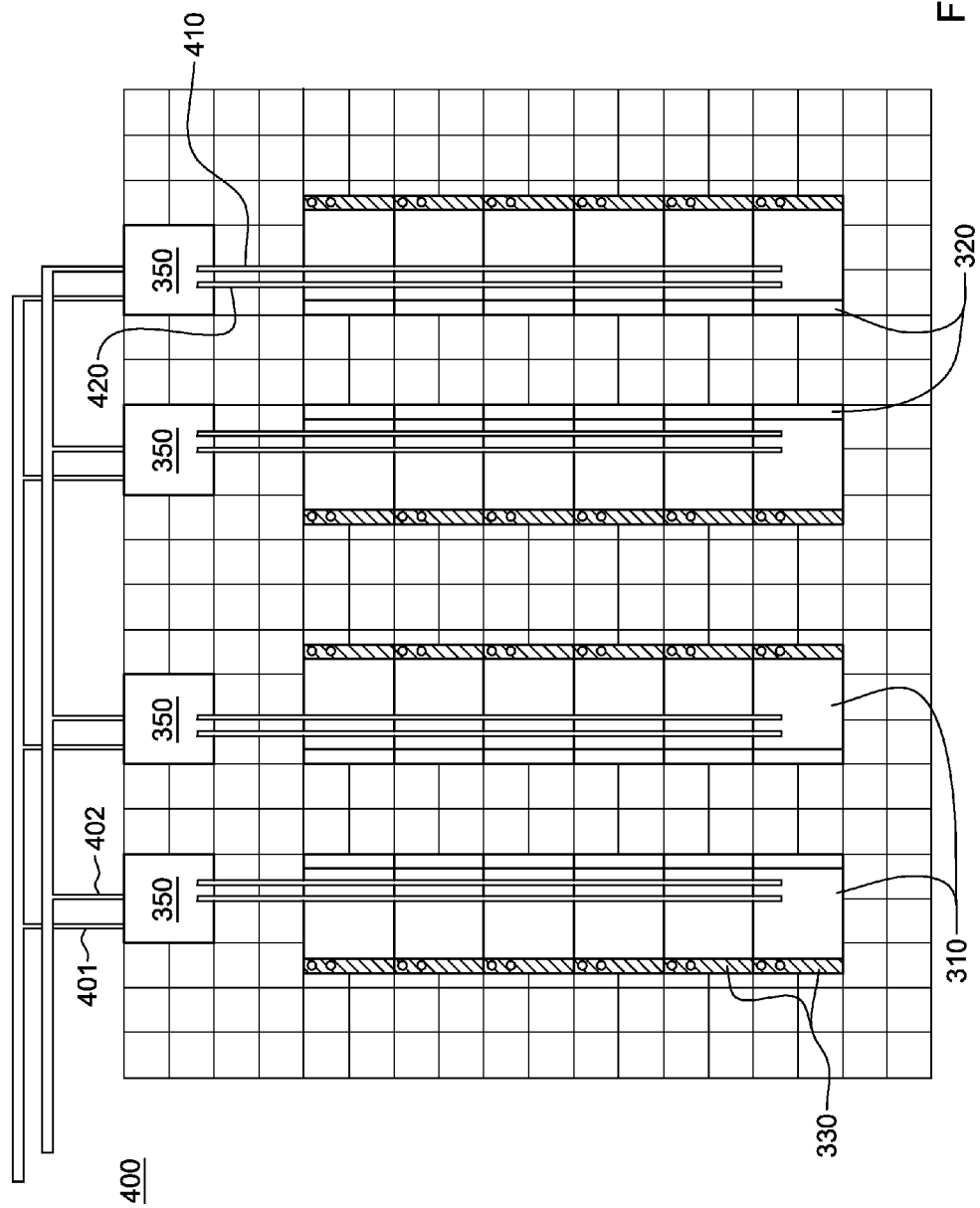
FIG. 4 is a top plan view of one embodiment of a data center employing cooling apparatuses comprising outlet door air-to-liquid heat exchangers, in accordance with an aspect of the present invention.

FIG. 4 is a plan view of one embodiment of a data center, generally denoted 400, employing cooled electronics systems, in accordance with an aspect of the present invention. Data center 400 includes a plurality of rows of electronics racks 310, each of which includes an inlet door 320 and a hinged outlet door 330, such as described above in connection with the embodiment of FIG. 3. Each outlet door 330 supports an air-to-liquid heat exchanger and system coolant inlet and outlet plenums as described further hereinbelow. Multiple cooling units 350, referred to hereinbelow as pumping units, are disposed within the data center (along with one or more air-conditioning units (not shown)). In this embodiment, each pumping unit forms a system coolant distribution subsystem with one row of a plurality of electronics racks. Each pumping unit includes a liquid-to-liquid heat exchanger where heat is transferred from a system coolant loop to a facility coolant loop. Chilled facility coolant, such as water, is received via facility coolant supply line 401, and is returned via facility coolant return line 402. System coolant, such as refrigerant, is provided via a system coolant supply header 410 extending over the respective row of electronics racks, and is return via a system coolant return header 420 also extending over the respective row of electronics racks. In one embodiment, the system coolant supply and return headers 410, 420 are hard-plumbed within the data center, and preconfigured to align over and include branch lines extending towards electronics racks of a respective row of electronics racks.

Figure 5:
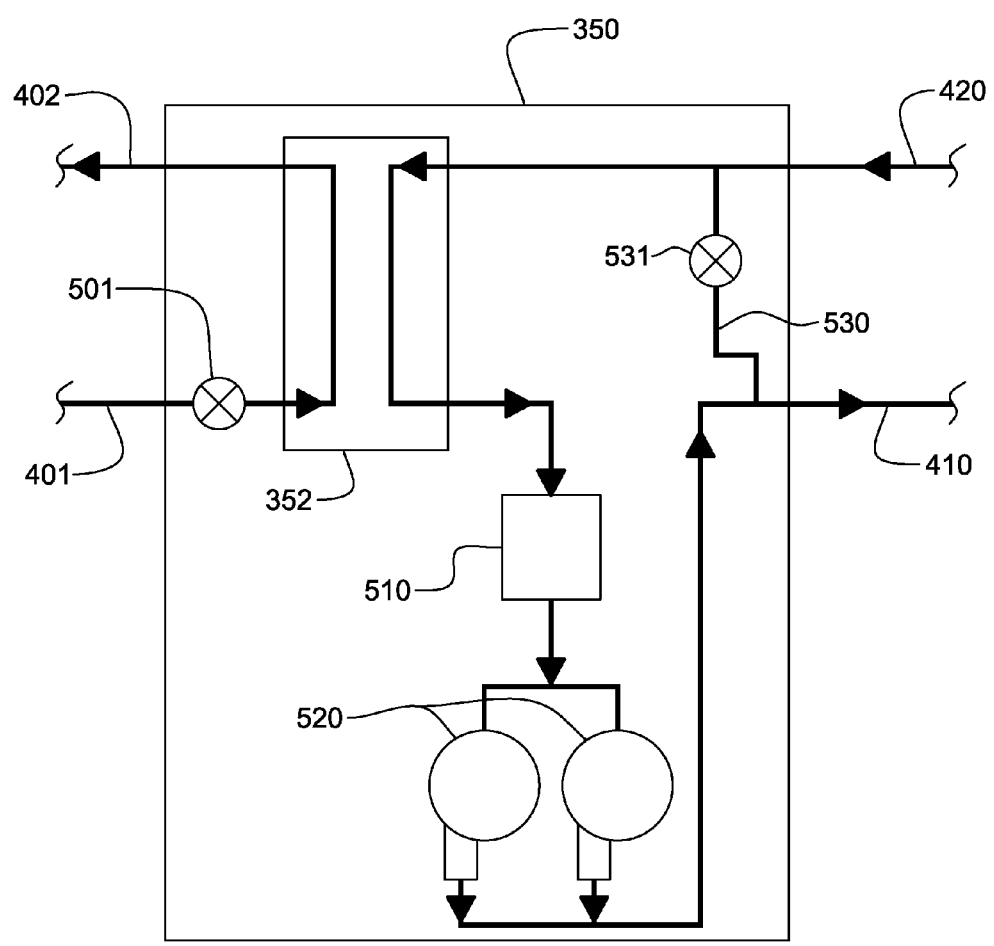
FIG. 5 is a schematic of one embodiment of a coolant distribution unit to be used in the data center of FIG. 4, in accordance with an aspect of the present invention.

FIG. 5 depicts one embodiment of a cooling unit 350 for the data center 400 of FIG. 4. Liquid-to-liquid heat exchanger 352 condenses a vapor-liquid refrigerant mixture passing through the system coolant loop comprising system coolant supply header 410 and system coolant return header 420. (In one embodiment, the system coolant has undergone heating and partial vaporization within the respective air-to-liquid heat exchangers disposed within the outlet doors of the electronics racks.) The facility coolant loop of liquid-to-liquid heat exchanger 352 comprises facility coolant supply line 401 and facility coolant return line 402, which in one embodiment, provides chilled facility water to the liquid-to-liquid heat exchanger. A control valve 501 may be employed in facility coolant supply line 401 to control facility coolant flow rate through the liquid-to-liquid heat exchanger 352. After the vapor-liquid refrigerant mixture condenses within liquid-to-liquid heat exchanger 352, the condensed refrigerant is collected in a condensate reservoir 510 for pumping via a redundant pump assembly 520 back to the respective row of electronics racks via system coolant supply header 410. As shown in FIG. 5, a bypass line 530 with a bypass valve 531 may be employed to control the amount of system coolant fed back through the system coolant supply header, and hence, control temperature of system coolant delivered to the respective air-to-liquid heat exchangers mounted to the doors of the electronics racks.

Figure 6:
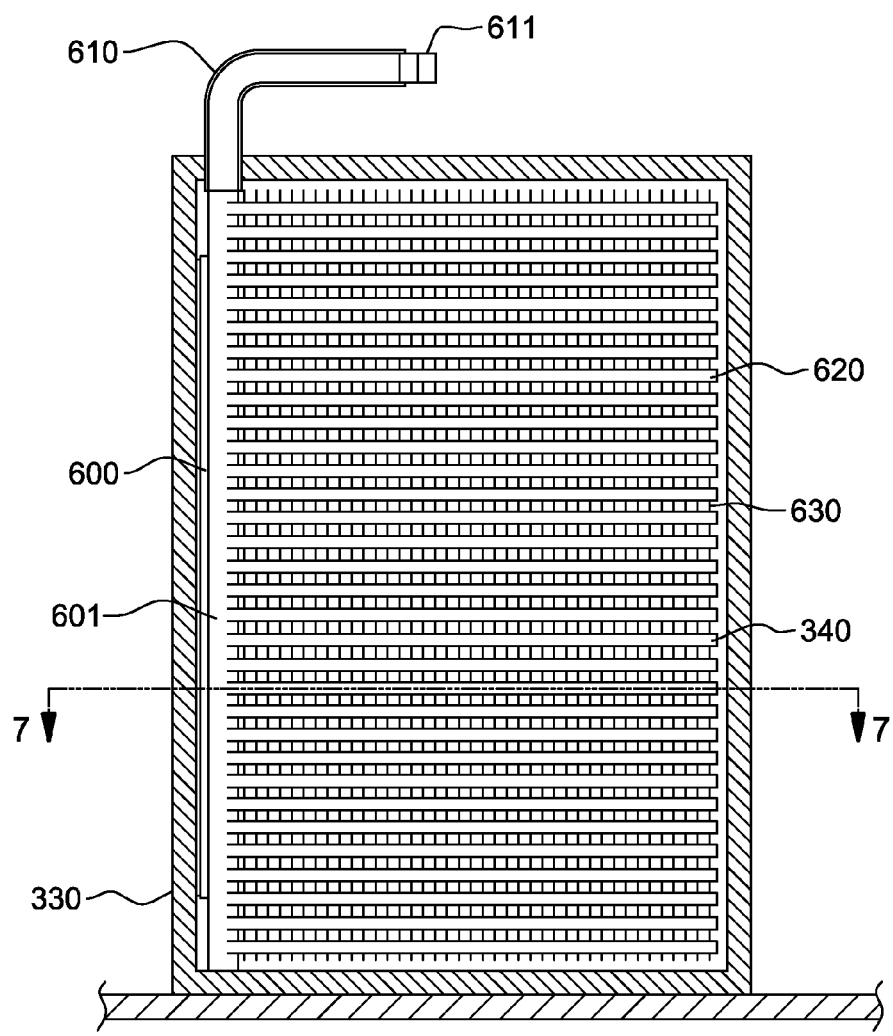
FIG. 6 is a partial cross-sectional, elevational view of one embodiment of an electronics rack door and cooling apparatus mounted thereto, taken along line 6-6 in FIG. 7, in accordance with an aspect of the present invention.
Figure 7:
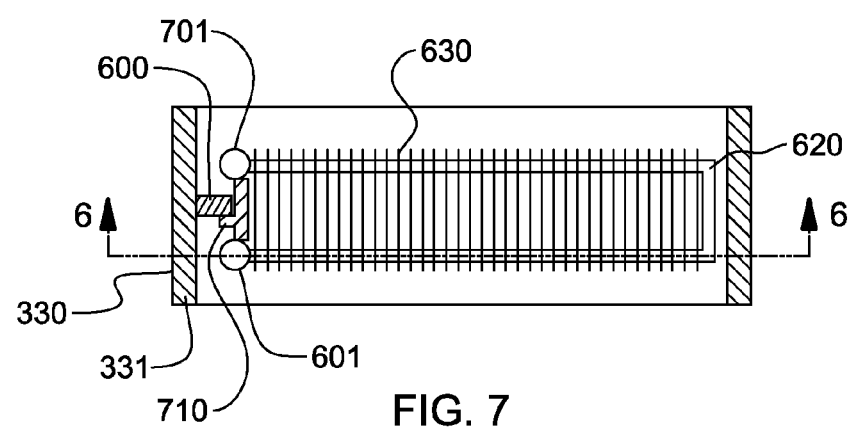
FIG. 7 is a cross-sectional, top plan view of the door and cooling apparatus of FIG. 6, taken along line 7-7 in FIG. 6, in accordance with an aspect of the present invention.

FIGS. 6 & 7 depict one embodiment of outlet door 330 supporting air-to-liquid heat exchanger 340, and system coolant inlet and outlet plenums 601, 701. Referring to both figures collectively, outlet door frame 331 supports a rigid flap 600, which attaches, for example, by brazing or soldering, to a plate 710 secured between the system coolant inlet plenum 601 and system coolant outlet plenum 701.

In FIG. 6, right angle bend 610 is shown disposed at the top of system coolant inlet plenum 601. This right angle bend defines a horizontal inlet plenum portion, which extends above the top of door 330. The coolant inlet to system coolant inlet plenum 601 is coupled to a connect coupling 611 for facilitating connection thereof to the respective supply hose, as described above. The air-to-liquid heat exchanger comprises a plurality of horizontally-oriented heat exchange tube sections 620. These heat exchange tube sections 620 each comprise a coolant channel having an inlet and an outlet, with each coolant channel being coupled to the system coolant inlet plenum 601 and each coolant channel outlet being coupled to the system coolant outlet plenum 701. A plurality of fins 630 are attached to horizontally-oriented heat exchange tube sections 620 for facilitating transfer of heat from air passing across the air-to-liquid heat exchanger to coolant flowing through the plurality of heat exchange tube sections 620. In one embodiment, the plurality of fins is vertically-oriented, rectangular fins attached to horizontally-oriented heat exchange tube sections 620.

Due to the low saturation (boiling) temperature of liquid refrigerant, removal of a heat load exiting the back of an electronics rack via the refrigerant will cause the refrigerant to vaporize within the heat exchange tube sections of the air-to-liquid heat exchanger, resulting in two-phase flow and latent heat transfer. Two-phase latent heat transfer is very effective as a heat removal method; however, problems occur in the area of refrigerant flow distribution within the air-to-liquid heat exchanger and across multiple air-to-liquid heat exchangers of the data center due to vaporization of the refrigerant.

For example, within an air-to-liquid heat exchanger at the air outlet side of an electronics rack such as described above, liquid refrigerant is pumped into a vertical supply plenum, from which the refrigerant flows through several parallel heat exchange tube sections spanning the width of the air-to-liquid heat exchanger, eventually mixing in the vertical return plenum. As a result of slightly lower refrigerant flow rates in the lower heat exchange tube sections of the air-to-liquid heat exchanger caused by pressure drops due to pipe fittings and friction, refrigerant flowing through these lower sections will have a tendency to vaporize first upon introduction of a (uniform) heat load to the air-to-liquid heat exchanger.

When liquid refrigerant vaporizes in one of the heat exchange tube sections due to an applied heat load, the pressure drop experienced across that heat exchange tube section will equal several times the magnitude of the pressure drop experienced by single-phase liquid refrigerant flowing through the tube section. This increased pressure drop creates a "resistance" for the refrigerant to flow in the lower tube sections where two-phase latent heat transfer is occurring. As liquid flows through the coolant inlet plenum, with several parallel paths to choose from, more liquid will flow through the tube section with the least resistance, that is, the lowest pressure drop. It has been observed through testing that latent heat removal affects increase from the upper sections of the rear door heat exchanger to the lower sections thereof. The greater the degree of vaporization due to increased latent heat transfer occurring in the lower heat exchange tube sections, the larger the pressure drop, which causes a mal-distribution of refrigerant flow through the heat exchanger (and higher coolant pumping power consumption). Increased amounts of liquid bypass the lower sections of the rear door heat exchanger, where latent heat transfer is occurring, resulting in increased single-phase liquid flow through the upper heat exchange tube sections and decreased two-phase flow through the lower heat exchange tube sections of the air-to-liquid heat exchanger. Single-phase refrigerant flow does not provide the desired heat removal effects of latent heat transfer, and thus is to be avoided.

It is one goal of the present invention to develop an effective mechanism for eliminating mal-distribution of refrigerant flow through multiple electronics racks of a data center, as well as within a heat exchange assembly between the heat exchange tube sections thereof to enhance heat transfer and/or minimize coolant pumping requirements.

Figure 8:
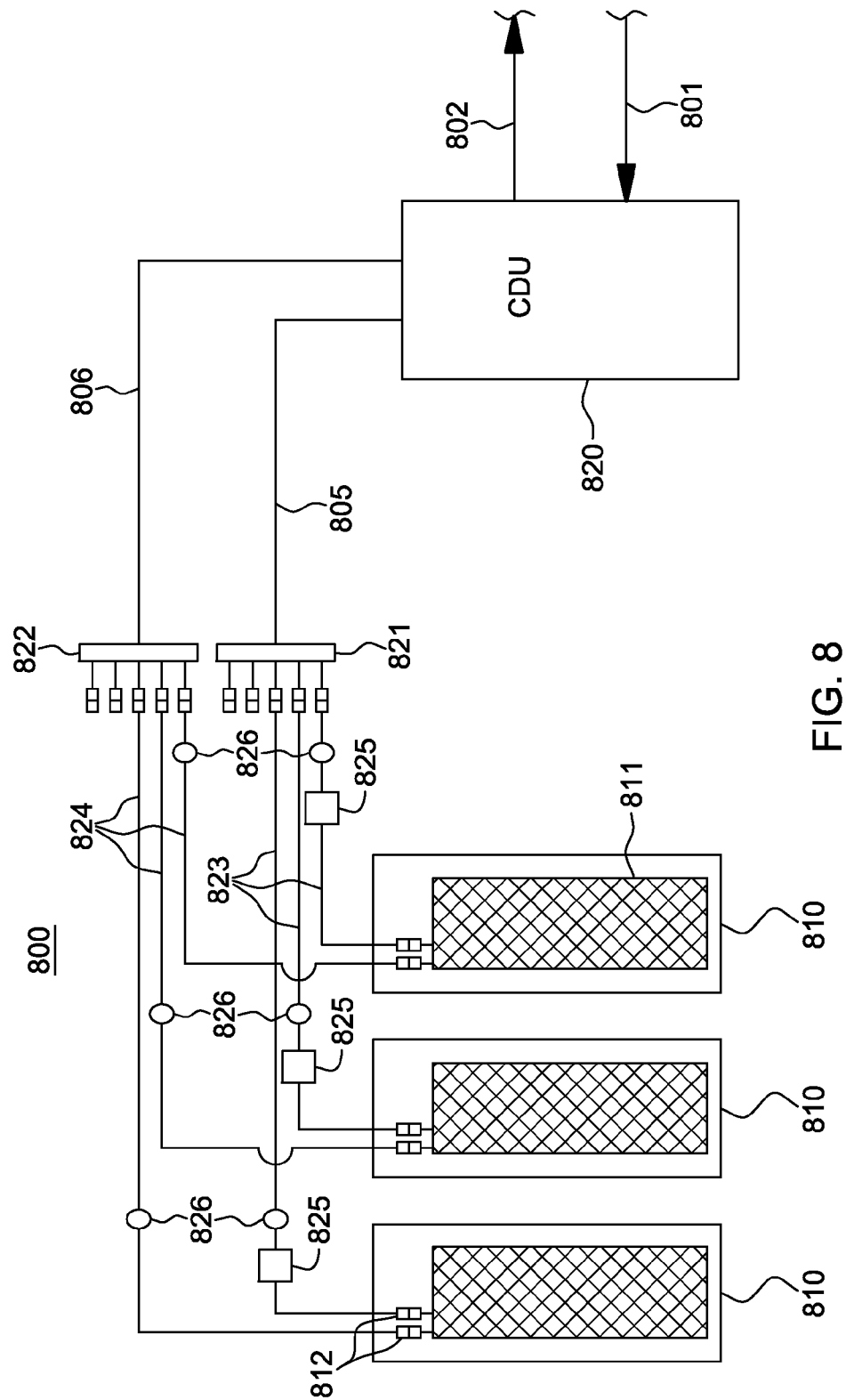
FIG. 8 is a schematic of one embodiment of a data center comprising a cooling apparatus for distributing coolant flow between electronics racks of the data center, in accordance with an aspect of the present invention.
Figure 9A:
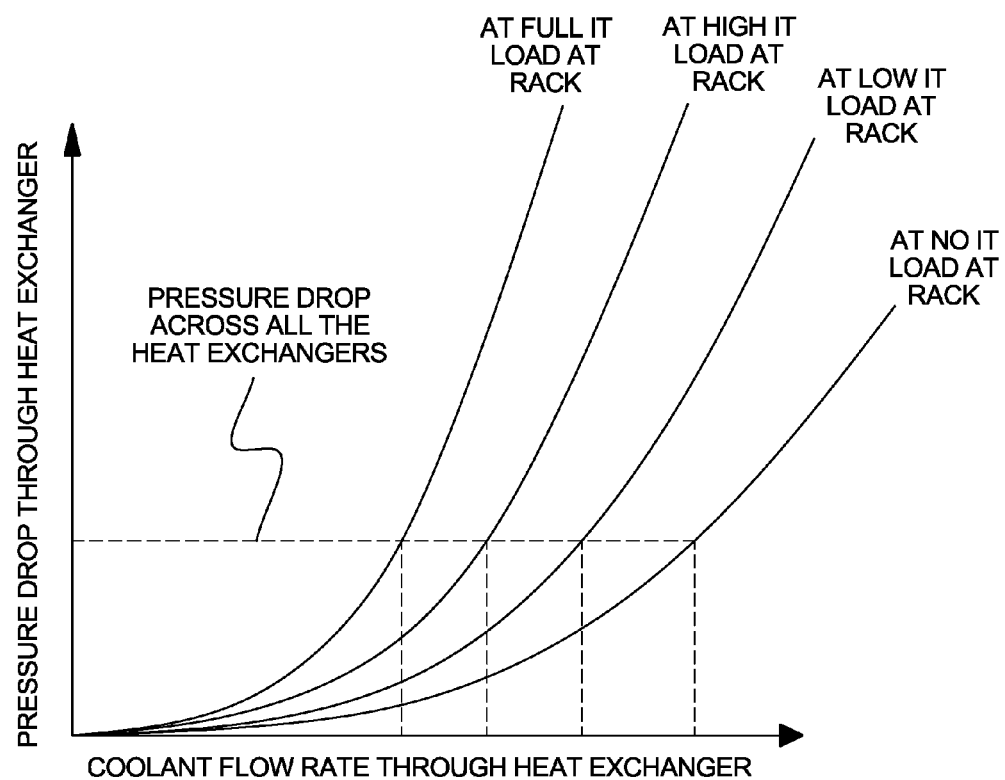
FIG. 9A is a graph of one embodiment of pressure drop through several heat exchangers at different load versus coolant flow rates through the heat exchangers, illustrating potential maldistribution of coolant flow across the heat exchangers of multiple electronics racks of a data center, which is addressed in accordance with an aspect of the present invention.
Figure 9B:
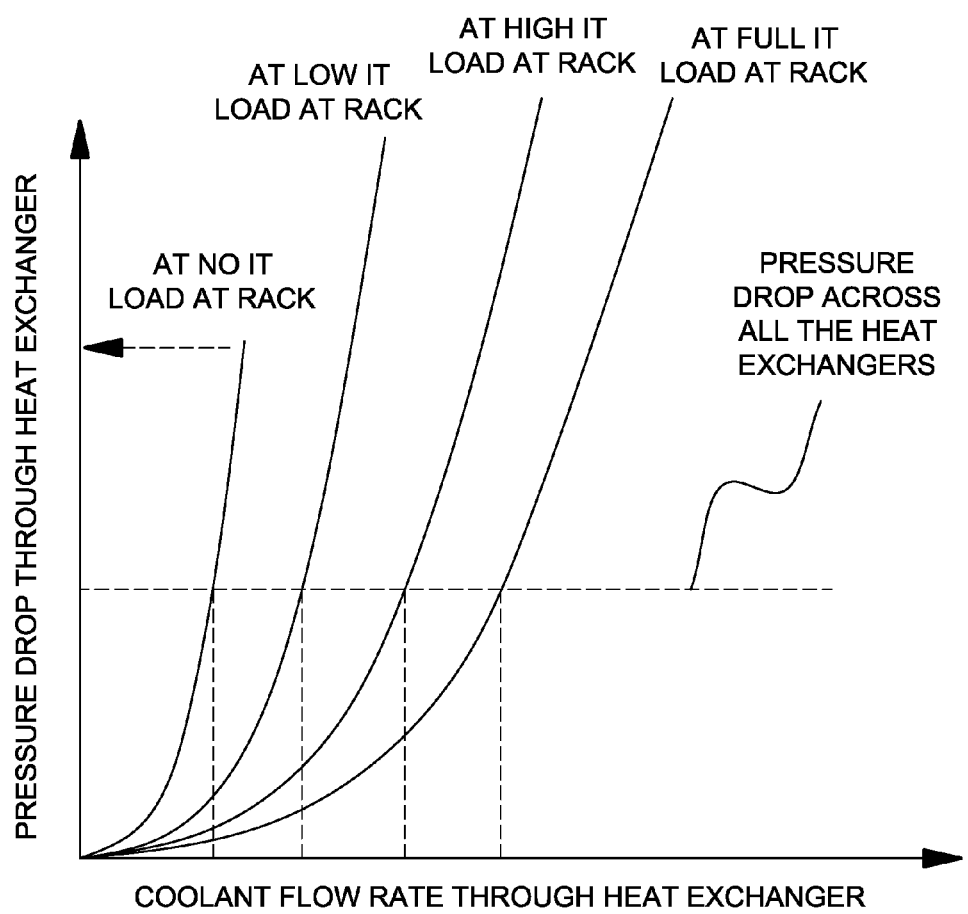
FIG. 9B is a graph of pressure drop through several heat exchangers at different load versus coolant flow rates through the heat exchangers, wherein multiple flow restrictors are utilized to tailor coolant flow resistance through the heat exchangers of the multiple electronics racks to ensure that the high heat load electronics rack receives a maximum coolant flow, in accordance with an aspect of the present invention.
Figure 10:
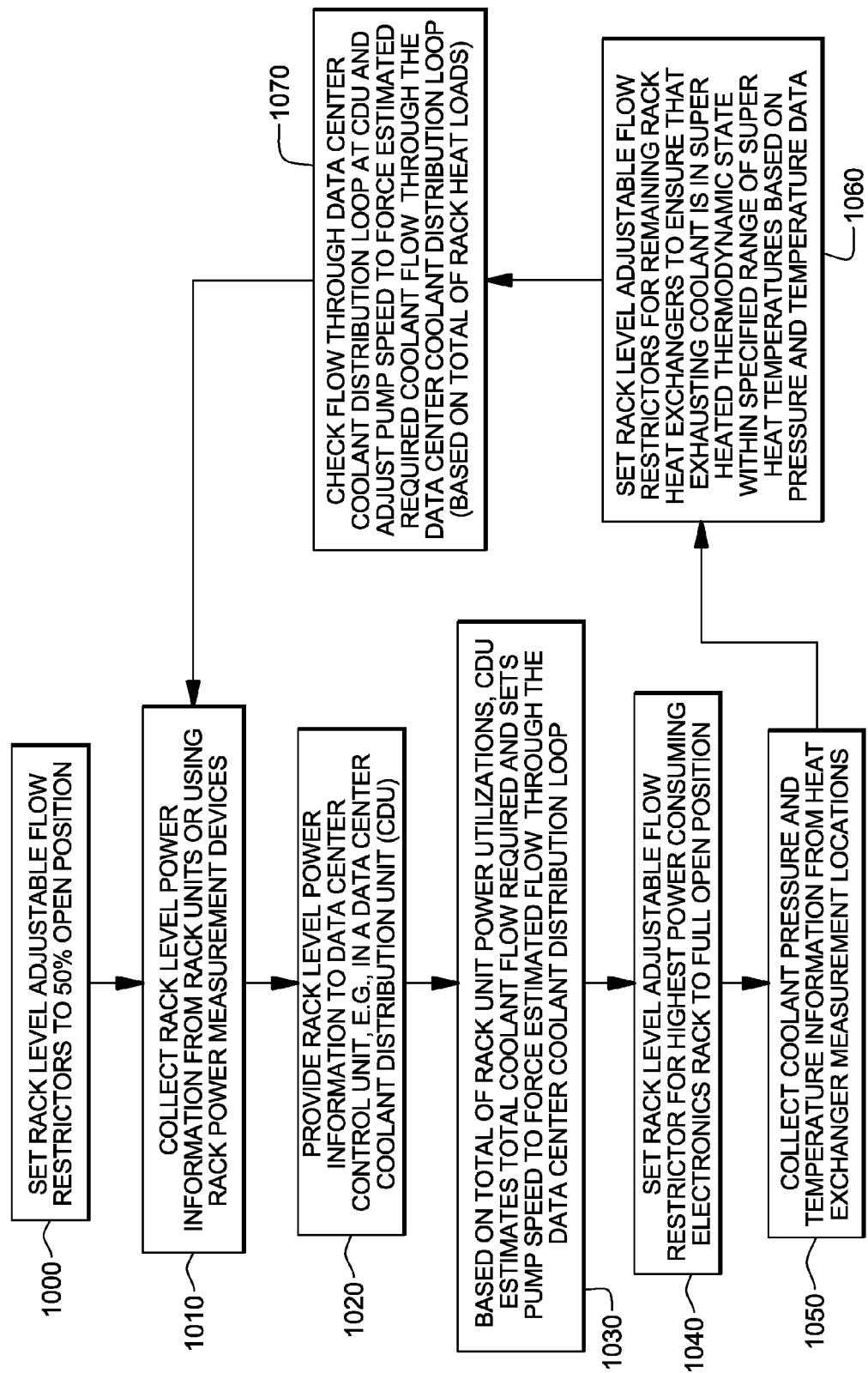
FIG. 10 depicts one embodiment of logic for adjusting coolant flow resistance to multiple heat exchange assemblies of multiple electronics racks to be cooled, in accordance with an aspect of the present invention.

FIGS. 8-10 address coolant flow mal-distribution between electronics racks of a data center, while FIGS. 11-18 address mal-distribution of coolant flow between heat exchange tube sections of a heat exchange assembly coupled to or associated with an electronics rack.

Referring first to FIG. 8, a data center 800 is illustrated comprising a plurality of electronics racks 810 and a coolant distribution unit 820. Each electronics rack 810 includes a heat exchange assembly 811, such as described herein. Specifically, heat exchange assembly 811 includes an air-to-liquid heat exchanger, a coolant inlet plenum, and a coolant outlet plenum, with multiple heat exchange tube sections of the air-to-liquid heat exchanger being coupled in parallel between the coolant inlet plenum and the coolant outlet plenum. The coolant distribution unit 820 may comprise, for example, a cooling unit such as described above in connection with FIG. 5. Within coolant distribution unit 820, a liquid-to-liquid heat exchanger is employed to facilitate transfer of heat from system coolant to facility coolant passing through the coolant distribution unit (via facility coolant supply line 801 and facility coolant return line 802). As illustrated in FIG. 8, a main system coolant supply line 805 supplies cooled system coolant to a coolant supply manifold 821, and a main coolant return line 806 receives exhausted system coolant via a coolant return manifold 822. A plurality of coolant supply lines 823 and a plurality of coolant return lines 824 facilitate coupling coolant distribution unit 820 in fluid communication with the plurality of heat exchange assemblies 811 associated with the electronics racks 810. In one embodiment, quick connect couplings 812 are employed to connect the individual coolant supply lines and coolant return lines to the respective heat exchange assemblies 811. By way of example, these quick connect couplings may comprise various types of commercially available couplings, such as those available from Colder Products Company, of St. Paul, Minn., USA, or Parker Hannifin, of Cleveland, Ohio, USA.

FIG. 9A illustrates potential mal-distribution of system coolant flow through the heat exchange assemblies of the electronics racks using the closed system coolant loop configuration of FIG. 8. As illustrated, due to the effects of two-phase flow on pressure drop, for an overall constant pressure drop across the heat exchange assemblies, an electronics rack at no information technology (IT) load experiences the highest coolant flow rate through its associated heat exchange assembly, while an electronics rack at full IT load experiences the lowest coolant flow rate through its heat exchange assembly. These flow characteristics for the different heat load conditions cause undesirable refrigerant flow mal-distribution at the data center level.

Returning to FIG. 8, a plurality of flow restrictors 825 are provided in association with the plurality of coolant supply lines 823 (in one embodiment), with each flow restrictor being associated with a respective coolant supply line 823 for tailoring coolant flow resistance through that line. In addition, pressure and temperature sensors 826 are provided (in one embodiment) on each coolant supply line 823 and each coolant return line 824. Flow restrictors 825 are, by way of example, adjustable flow restrictors, each of which comprises a dynamically adjustable orifice opening size for tailoring coolant flow resistance through the respective coolant line, and thus through the respective heat exchange assembly of the associated electronics rack based on its heat load.

By dynamically adjusting the orifice opening sizes of the adjustable flow restrictors, a cooling apparatus is provided which is able to tailor (or adjust) coolant flow through the respective heat exchange assemblies, for example, based on the current IT loads of the associated electronics racks. This is illustrated in FIG. 9B. As shown, the flow restrictors are controlled so that, for a constant overall pressure drop across the heat exchange assemblies associated with the plurality of electronics racks in the data center, an electronics rack at no IT load receives the lowest (or no) coolant flow rate, while an electronics rack at full IT load receives the highest coolant flow rate through its respective air-to-liquid heat exchanger. This adjusting of the flow resistance is significant in a system which employs refrigerant and latent heat transfer, such as proposed herein.

FIG. 10 illustrates one embodiment of logic for controlling the adjustable flow restrictors illustrated in FIG. 8, as well as overall coolant flow. Initially, each adjustable flow restrictor (i.e., each rack-level adjustable flow restrictor) is set to 50% open position 1000, and the rack-level IT loads are obtained from the electronics racks or measured using power measurement devices 1010. This rack-level load (or power consumed) information is provided to a data center control unit, for example, disposed within the one or more coolant distribution units (CDUs) of the data center 1020. Based on the total rack power utilizations, the control unit estimates the total refrigerant flow required and sets the pump speed of the CDUs to force the estimated coolant flow through the data center coolant distribution loop 1030. The rack-level adjustable flow restrictor for the highest power-consuming electronics rack is set to full open position 1040, and coolant pressure and temperature information is collected from the coolant supply and return measurement locations 1050, for example, from pressure and temperature sensors associated with the plurality of coolant supply lines and the plurality of coolant return lines, such as discussed above in connection with FIG. 8. The rack-level adjustable flow restrictors for the remaining heat exchangers are then set to ensure that the exhausting coolant from each heat exchange assembly is in a super-heated, thermodynamic state within a specified range of super-heated temperatures, based on the pressure and temperature data for that rack 1060. Logic checks the flow through the data center distribution coolant loop at the coolant distribution unit(s) and adjusts the pump speed to force the estimated required flow through the loop based on the total of the rack heat loads 1070, and returns (for example, after a defined time delay) to collect the current rack-level power utilizations from the electronics racks 1010, before repeating the process.

Note that pressure and temperature sensors 826 are provided in the plurality of coolant supply lines 823 and the plurality of coolant return lines 824 in the data center embodiment illustrated in FIG. 8. These pressure and temperature sensors allow for the determination of the thermodynamic state of the refrigerant as it enters and exits the heat exchange assemblies 811 and associated flow restrictors 825. It is desirable for the coolant exiting the heat exchanger subassembly 811 to be slightly super-heated, that is, with no liquid content. Pressure (P)—enthalpy (H) diagrams for R-134a refrigerant are available in the literature, which indicate the regions in which such a refrigerant is sub-cooled, saturated, or super-heated. These diagrams (or functions) utilize variables, such as pressure and temperature (or enthalpy if the quality of the two-phase mixture needs to be known). Thus, the thermodynamic state of the coolant can be determined and controlled using pressure and temperature data. The pressure and temperature values measured will be input into a coolant-dependant algorithm (defined by the P-H diagram/properties of the coolant) that determines if the coolant is super-heated. This algorithm can be readily ascertained by one skilled in the art.

If the coolant is not super-heated (i.e., the coolant is sub-cooled or in a two-phase saturated condition), the algorithm will modulate the adjustable flow restrictors 825 associated with the heat exchange assemblies until the exiting coolant is super-heated. This ensures that all coolant exiting the heat exchanger has utilized its latent coolant effects and there is a 100% vapor in the return plenum. The modulation of the adjustable orifices serves to increase the flow resistance, and thus, redirects coolant flow to ensure sufficient vaporization and cooling in all sections of the heat exchange assemblies. If the heat load of a specific electronics rack that has a low coolant flow suddenly increases, then the extent of super-heat will be determined using the same pressure and temperature sensor information. If the degree of super-heat is too much, then the controller will open the respective flow restrictor, thereby reducing the flow resistance through the heat exchange assembly and thus attracting more coolant flow, thereby reducing the degree of super-heat. Thus, one skilled in the art will note that the control algorithm employed can determine the thermodynamic state using pressure and temperature data, manipulate the flow restrictor to force a super-heated condition, and also force the degree of super-heat so as to be within a specific temperature differential in excess of the saturated condition. For example, if for a specific design, the saturated temperature of the refrigerant flow is 18° C., then the flow restrictor may be controlled to force the exhaust refrigerant vapor to be at 20° C.

Various actively controlled, adjustable flow restrictors are available in the art. For example, reference the EX4 or EX6 refrigerant flow control valves offered by Emerson Electric Company, of St. Louis, Miss., U.S.A.

FIGS. 11-18 depict a further aspect of the present invention, wherein one or more flow restrictors are employed within a rear door, air-to-liquid heat exchanger (such as described above) for tailoring coolant flow resistance through one or more heat exchange tube sections of the air-to-liquid heat exchanger to enhance overall heat transfer across the multiple heat exchange tube sections. In one example, the one or more flow restrictors ensure that vaporization occurs within each tube section of the multiple tube sections of the heat exchanger for a given operating condition or range of conditions. By achieving this, flow resistance gradients that might otherwise exist within the rear door heat exchanger are eliminated, allowing for a more uniform refrigerant flow and consistent latent heat transfer in the tube sections. Once latent heat removal occurs roughly equally within the heat exchange tube sections (for uniform heat loads) of the rear door heat exchanger, greater heat removal is realized.

Various installations of flow restrictors within a rear door heat exchanger are described below. In a system where the rear door heat exchanger (or multiple rear door heat exchangers) receives refrigerant pumped from a coolant distribution unit, the refrigerant should be maintained as a sub-cooled liquid through the supply lines in communication with the rear door heat exchanger(s). Once the sub-cooled liquid (refrigerant) reaches its saturation pressure for a given temperature, the liquid begins to vaporize. To bring sub-cooled refrigerant into saturation, a flow restrictor (such as described above in connection with FIG. 8) may be employed within the supply and/or return lines immediately before and/or after the rear door heat exchanger, which is designed to create a pressure drop to bring the refrigerant to saturation before entering the heat exchanger. This method ensures that the refrigerant is on the verge of vaporization as delivered to the coolant inlet plenum of the heat exchanger.

Figure 11:
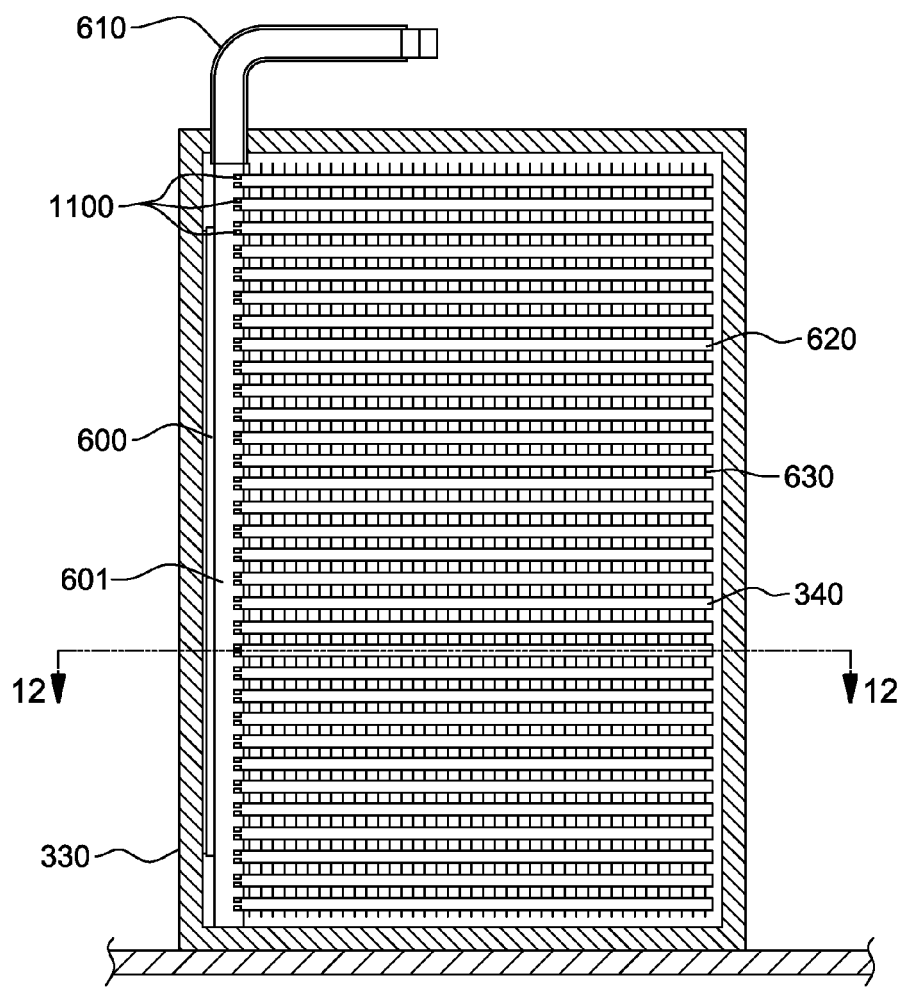
FIG. 11 is a partial cross-sectional, elevational view of the electronics rack door and cooling apparatus of FIG. 6, with a plurality of flow restrictors shown disposed at the coolant channel inlets and coolant channel outlets of the multiple heat exchange tube sections, and taken along line 11-11 in FIG. 12, in accordance with an aspect of the present invention.
Figure 12:
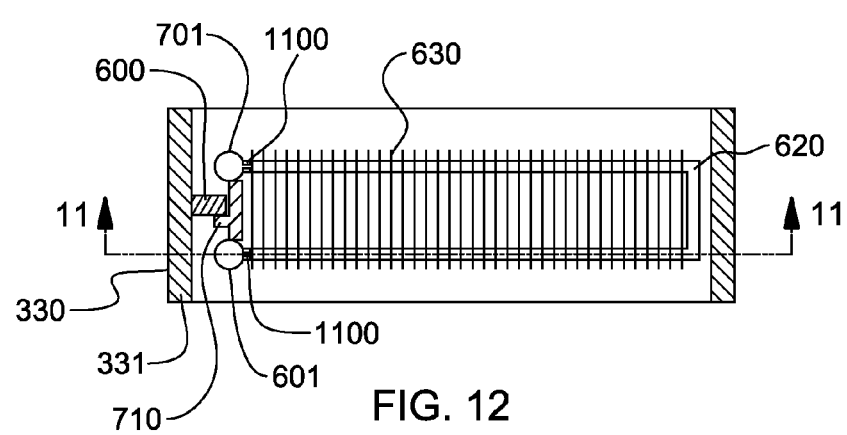
FIG. 12 is a cross-sectional, top plan view of the door and cooling apparatus of FIG. 11, taken along line 12-12 in FIG. 11, in accordance with an aspect of the present invention.

To further facilitate heat transfer across the heat exchange tube sections of the rear door heat exchanger, at least one fixed (or adjustable) flow restrictor is provided for each tube section, as illustrated in FIGS. 11 & 12. In one embodiment, these fixed or adjustable flow restrictors are disposed at the coolant channel inlets (and/or coolant channel outlets) to the respective heat exchange tube sections of the heat exchanger.

Referring collectively to FIGS. 11 & 12, and as noted above, rack outlet door 330 supports air-to-liquid heat exchanger 340, and system coolant inlet and outlet plenums 601, 701. Outlet door frame 331 supports a rigid flap 600, which attaches, for example, by brazing or soldering, to a plate 710 secured between the system coolant inlet plenum 601 and system coolant outlet plenum 701. In FIG. 11, a right angle bend 610 is shown disposed at the top of system coolant inlet plenum 601. This right angle bend defines a horizontal inlet plenum portion which extends above the top of door 330, which facilitates attaching a supply hose to the hinged outlet door. The air-to-liquid heat exchanger comprises a plurality of horizontally-oriented heat exchange tube sections 620. These heat exchange tube sections 620 each comprise a coolant channel having an inlet and an outlet, with each coolant channel inlet being coupled to the system coolant inlet plenum 601 and each coolant channel outlet being coupled to the system coolant outlet plenum 701. A plurality of fins 630 are attached to the horizontally-oriented heat exchange tube sections 620 for facilitating transfer of heat from air passing across the air-to-liquid heat exchanger to coolant flowing through the plurality of heat exchange tube sections 620. In one embodiment, the plurality of fins is vertically-oriented, rectangular fins attached to horizontally-oriented heat exchange tube sections 620.

As illustrated in FIGS. 11 & 12, a plurality of flow restrictors 1100 is provided at the heat exchange tube sections. In this embodiment, each heat exchange tube section 620 has a first flow restrictor at its coolant channel inlet and a second flow restrictor at its coolant channel outlet (by way of example only). These flow restrictors may comprise any desired combination of fixed or adjustable flow restrictors to accomplish the desired tailoring of coolant flow resistance through the respective heat exchange tube sections. In this initial example, the flow restrictors are assumed to comprise fixed orifice diameters, with at least two fixed orifice diameters of the flow restrictors being differently sized to define different coolant flow resistances through at least two heat exchange tube sections of the multiple heat exchange tube sections of the rear door heat exchanger. By defining different coolant flow resistances, the multiple flow restrictors tailor coolant flow to facilitate overall heat transfer within the multiple heat exchange tube sections of the air-to-liquid heat exchanger, for example, by facilitating vaporization of refrigerant within each of the heat exchange tube sections, or by equalizing flow across the heat exchange tube sections of the rear door heat exchanger, notwithstanding the presence of heat transfer gradients across the heat exchange tube sections. In an alternative embodiment, the flow restrictors may again comprise fixed orifice diameters (or opening sizes), with each orifice opening size of the flow restrictors being identical to ensure a common coolant flow through the multiple heat exchange tube sections of the rear door heat exchanger. This implementation might be advantageous where there is uniform heat flux across the heat exchange tube sections.

Figure 13:
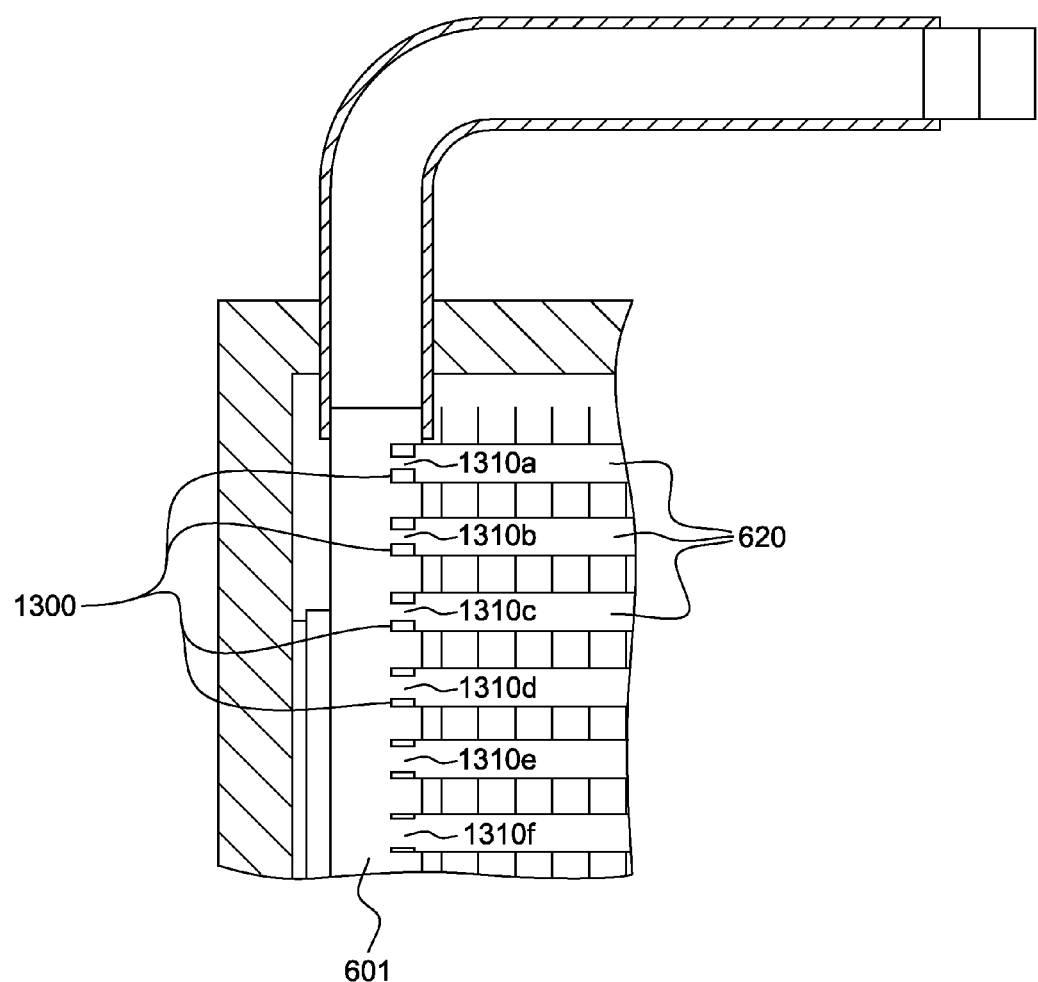
FIG. 13 is a partial cross-sectional, elevational view of one embodiment of an electronics rack door and cooling apparatus mounted thereto with multiple flow restrictors at the coolant channel inlets of the heat exchange tube sections which comprise different-sized orifice diameters that tailor coolant flow resistance through the multiple heat exchange tube sections, in accordance with an aspect of the present invention.

FIG. 13 depicts an alternate embodiment of an apparatus for facilitating cooling or removal of heat from an electronics rack, in accordance with an aspect of the present invention. This cooling apparatus is (in one embodiment) a rear door heat exchanger (such as described above) wherein only a portion of the heat exchanger is illustrated, including system coolant inlet plenum 601 and heat exchange tube sections 620. In this embodiment, multiple flow restrictors 1300 are illustrated at the coolant channel inlets of the respective heat exchange tube sections 620. Also, these flow restrictors 1300 are shown to comprise different orifice diameters (or opening sizes), wherein the apparatus transitions from a smaller orifice diameter 1310$a$ to a larger orifice diameter 1310$f$, progressing downwards from the top of the rear door heat exchanger towards the bottom. Using different orifice diameters within the flow restrictors produces different flow resistances, and for example, different magnitudes of flow resistances across the heat exchange tube sections. These different orifice diameters may be tailored to ensure equivalent or desired amounts of refrigerant flow to facilitate vaporization within each heat exchange tube section. Varying amounts of power consumption (or heat load) may be applied to the rear door heat exchanger from the associated electronics rack, and thus, varying the orifice diameters based on location of the heat exchange tube sections facilitates accommodating a range of heat load configurations.

Figure 14:
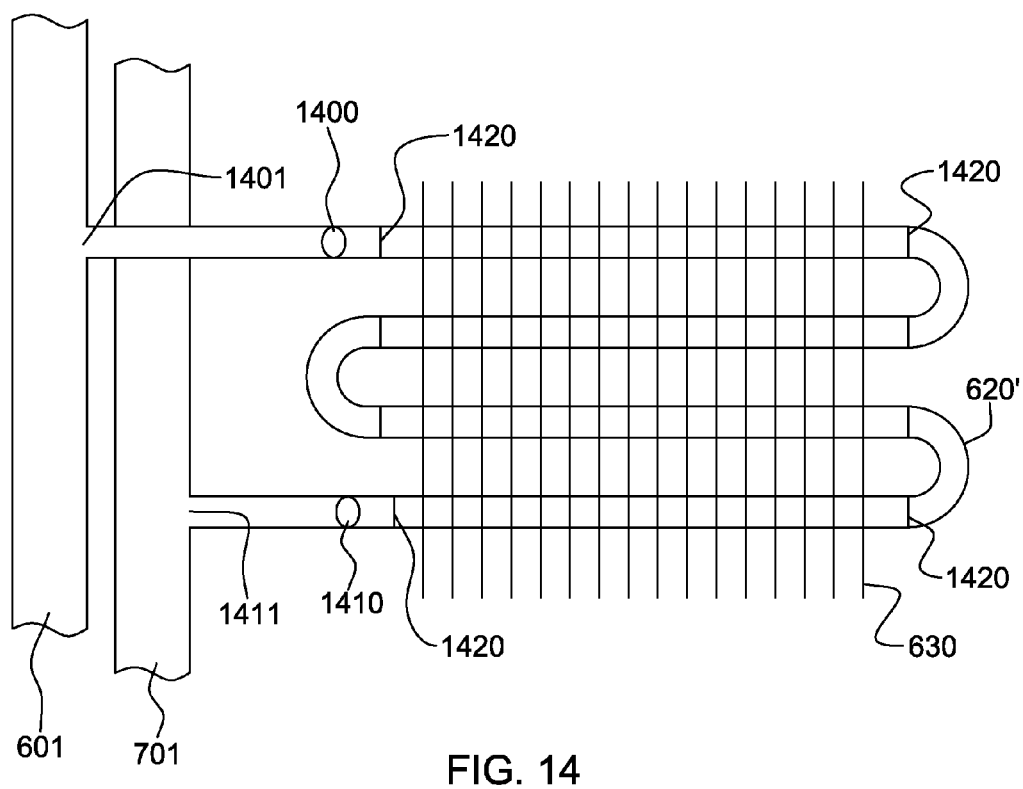
FIG. 14 is a schematic of one embodiment of a heat exchange assembly comprising a heat exchange tube section with a first, fixed diameter flow restrictor at the coolant channel inlet of the heat exchange tube section and a second, fixed diameter flow restrictor at the coolant channel outlet of the heat exchange tube section for adjusting coolant flow resistance through the tube section, in accordance with an aspect of the present invention.

FIG. 14 depicts a partial rear door heat exchange apparatus for facilitating cooling of exhaust air at the air outlet side of an electronics rack. The apparatus includes an air-to-liquid heat exchanger comprising a coolant inlet plenum 601, a coolant outlet plenum 701 and multiple heat exchange tube sections 620', only one of which is illustrated in FIG. 14. Each heat exchange tube section includes a sinusoidal coolant channel formed, in this example, from a plurality of straight channels with U-shaped bends attached to the ends thereof, and including a coolant channel inlet 1401 and coolant channel outlet 1411. Each coolant channel inlet 1401 is in fluid communication with coolant inlet plenum 601, and each coolant channel outlet 1411 is in fluid communication with coolant outlet plenum 701. As illustrated, multiple braze points 1420 are employed during one manufacturing embodiment of the sinusoidal heat exchange tube section to attach the straight channel portions to the U-shaped portions, as well as to attach the coolant channel inlet and coolant channel outlet to the respective plenums.

During fabrication of the rear door heat exchanger, a first flow restrictor 1400 can be placed into the heat exchange tube section at the coolant channel inlet, and a second flow restrictor 1410 can be placed in the heat exchange tube section at the coolant channel outlet. As explained further below, these flow restrictors may be brazed or crimped into position, followed by the normal brazing 1420 of the straight channel sections used in forming the desired heat exchange tube section configuration. By way of example only, first flow restrictor 1400 and second flow restrictor 1410 have fixed diameter orifices selected to adjust the flow resistance through the respective heat exchange tube section based on testing of the heat exchange design with two-phase refrigerant heat transfer. Note that although illustrated in FIG. 14 as including two flow restrictors, that is, one at the coolant channel inlet and one at the coolant channel outlet, the cooling apparatus disclosed herein could employ one flow restrictor of fixed orifice diameter (or adjustable orifice opening size) at either the coolant channel inlet or coolant channel outlet of the heat exchange tube section, or more than two flow restrictors disposed throughout the heat exchange tube section.

Figure 15A:
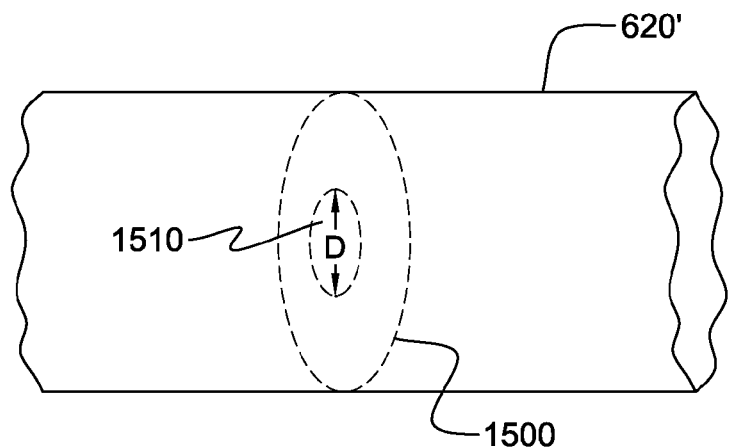
FIG. 15A is a schematic of one embodiment of a flow restrictor with a fixed orifice diameter for tailoring coolant flow resistance, in accordance with an aspect of the present invention.
Figure 15B:
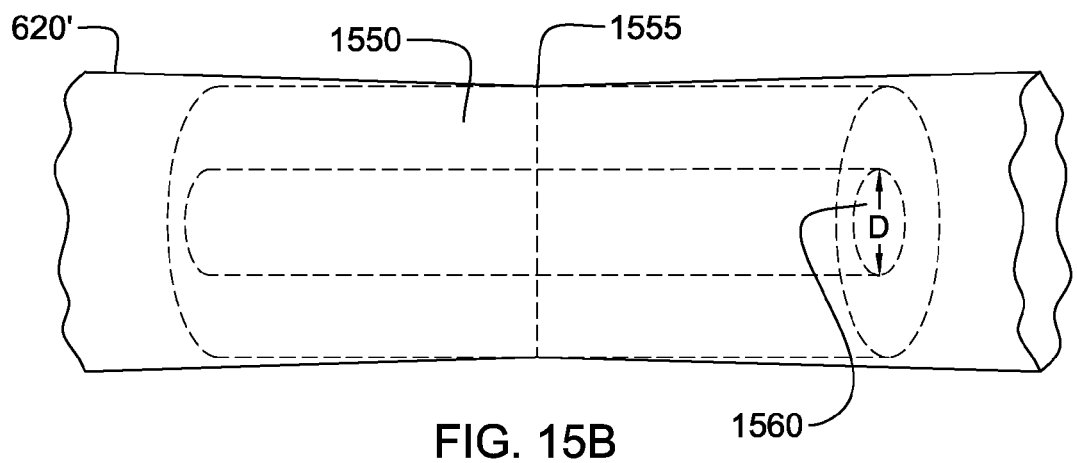
FIG. 15B depicts an alternate embodiment of a flow restrictor with a fixed orifice diameter for tailoring coolant flow resistance, in accordance with an aspect of the present invention.

FIGS. 15A & 15B depict alternate embodiments of a fixed orifice diameter flow restrictor, which may be used (for example) at the coolant channel inlet or coolant channel outlet of one or more heat exchange tube sections of the rear door heat exchanger described above.

In FIG. 15A, a flow restrictor disk 1500 is shown positioned in a heat exchanger tube section 620', for example, by brazing or other means of attaching the perimeter of the disk to the inner wall of the heat exchange tube section (which is assumed to be fabricated of metal). Flow restrictor 1500 has an orifice 1510 extending therethrough with a fixed orifice diameter D.

In the alternate embodiment of FIG. 15B, a cylindrical-shaped flow restrictor 1550 is illustrated crimped 1555 in position within a heat exchange tube section 620', for example, at the coolant channel inlet or coolant channel outlet thereof This cylindrical flow restrictor includes a cylindrical-shaped orifice 1560 extending therethrough. In the embodiment illustrated, the cylindrical-shaped orifice 1560 has a constant, fixed diameter D.

By way of specific example, a cylindrical flow restrictor such as depicted in FIG. 15B may be bored out to form a shell that may be inserted directly into an existing heat exchange tube section during the manufacturing process thereof. In one example, the heat exchange tube section utilizes ⅜ inch piping, and the cylindrical flow restrictor may be held in position via crimping to constrict the piping around the cylindrical flow restrictor. As with the disk-type flow restrictor, insertion of the cylindrical flow restrictor into the rear door heat exchanger piping is a simple manufacturing operation, is inexpensive and is a cost effective approach to achieving the desired tailoring of flow resistance through the respective heat exchange tube section. The fabrication method described herein ensures that all coolant flows through the orifice, resulting in the target flow restriction. Cylindrical flow restrictors containing different orifice diameters may be employed throughout the rear door heat exchanger to achieve the desired tailoring of coolant flow resistances through the heat exchange tube sections to enhance overall heat transfer within the multiple heat exchange tube sections of the air-to-liquid heat exchanger.

To satisfy changing cooling requirements across a rear door heat exchanger or between multiple rear door heat exchangers (as discussed above in connection with FIGS. 8-10), adjustable flow restrictors may be employed.

Figure 16:
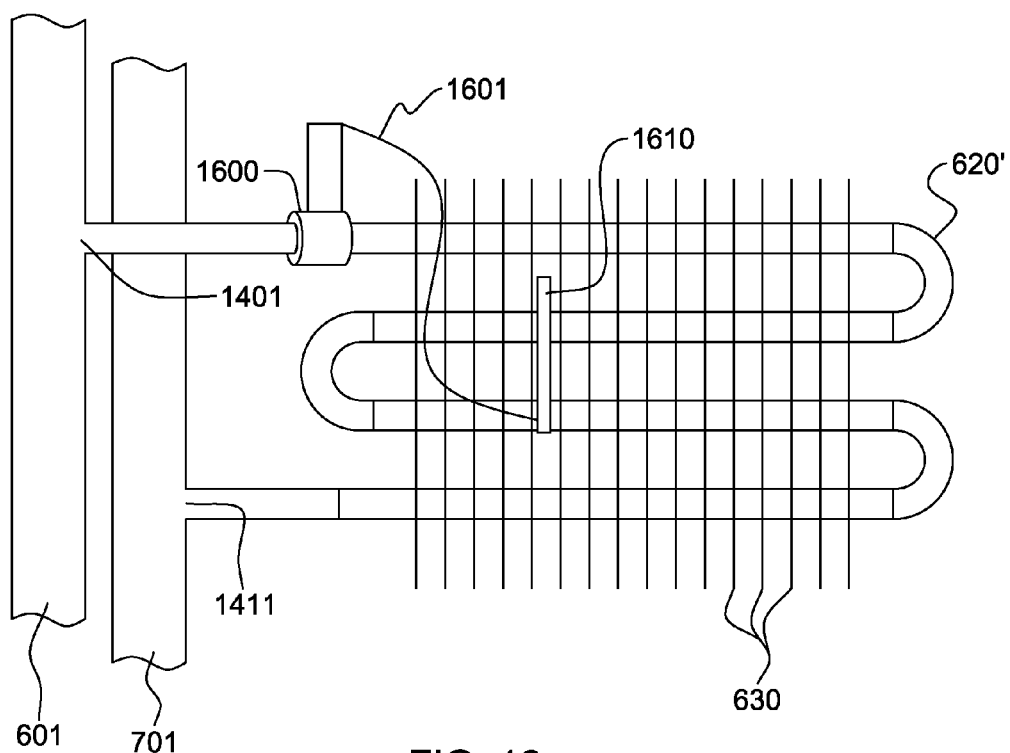
FIG. 16 is a schematic of an alternate embodiment of a heat exchange assembly comprising a heat exchanger with a passively controlled, adjustable flow restrictor disposed at the coolant channel inlet of the heat exchange tube section for dynamically adjusting coolant flow resistance through the heat exchange tube section based on sensed airflow temperature across the heat exchange tube section, in accordance with an aspect of the present invention.

FIG. 16 illustrates one embodiment of a passively controlled, adjustable flow restrictor 1600 at the coolant channel inlet 1401 of heat exchange tube section 620' coupling the tube section to coolant inlet plenum 601. As illustrated, heat exchange tube section 620' also couples to coolant outlet plenum 701 via its coolant channel outlet 1411. A plurality of fins 630 are attached to the horizontally-oriented heat exchange tube sections 620' for facilitating transfer of heat from air passing across the air-to-liquid heat exchanger to coolant flowing through the plurality of heat exchange tube sections 620' (only one of which is illustrated in the figure). In this embodiment, passively controlled adjustable flow restrictor 1600 comprises a thermal sensor 1610 for sensing temperature or exhaust airflow passing across the heat exchange tube section 620'. The sensed temperature 1610 is fed back 1601 to the passively controlled adjustable flow restrictor 1600.

As a specific example, temperature sensor 1610 might comprise a thermal sensing bulb and pneumatic/spring-actuated wire inserted into the air stream and coupling back to the passively controlled, adjustable flow restrictor 1600 located, for example, adjacent to the coolant channel inlet of the heat exchange tube section 620'. As a specific example, the passively controlled, adjustable flow restrictor might comprise a thermostatic-actuated valve, such as provided by Metrix Valve Corp. of Glendora, Calif., USA. This configuration provides the advantage that each heat exchange tube section is self-monitoring and adjusts the coolant flow resistance therethrough as required to cool the heat load passing across that tube section. No additional power or wiring is required to achieve the automated control. Additionally, the passively controlled, adjustable flow restrictor is reverse-acting in that as temperature of airflow across the tube section drops, the flow restrictor automatically at least partially closes, producing a greater pressure drop across, and lower coolant flow through, the heat exchange tube section.

Figure 17:
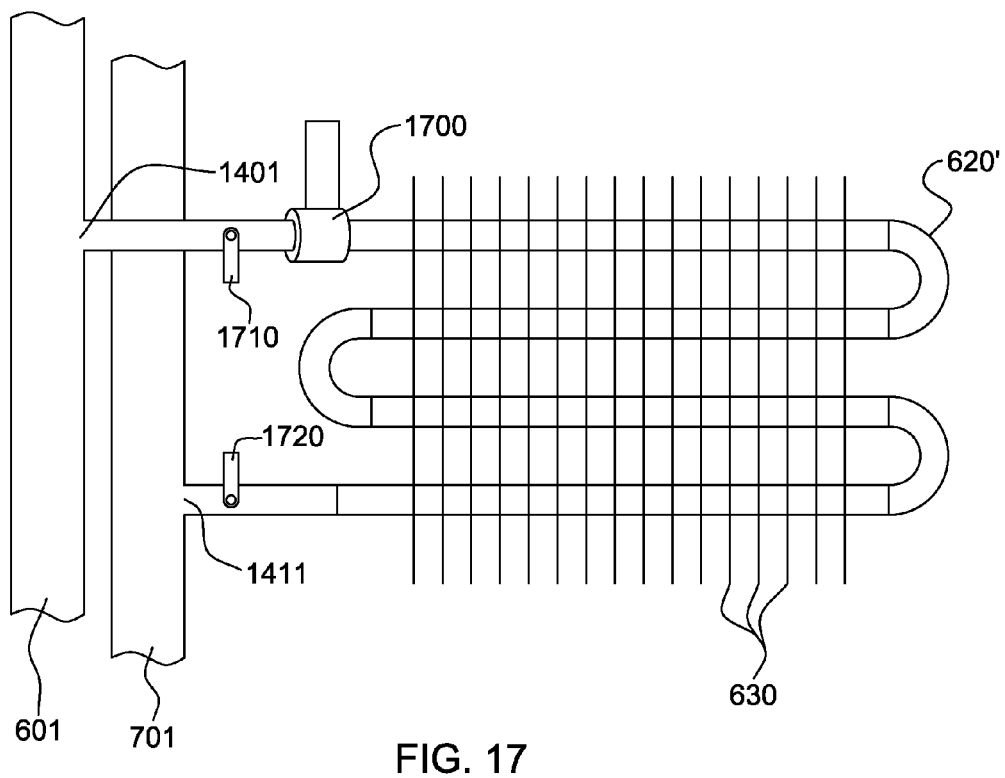
FIG. 17 depicts an alternate embodiment of a heat exchange assembly comprising a heat exchange tube section with an actively controlled, adjustable flow restrictor at the coolant channel inlet thereof, and pressure and temperature sensors at the coolant channel inlet and coolant channel outlet of the heat exchange tube section for dynamically adjusting the orifice opening size of the actively controlled, adjustable flow restrictor based on sensed pressure and temperature of coolant within the heat exchange tube section, in accordance with an aspect of the present invention.

FIG. 17 depicts an alternate embodiment of a cooling apparatus in accordance with an aspect of the present invention. In this embodiment, the apparatus again comprises an air-to-liquid heat exchanger having a coolant inlet plenum 601, coolant outlet plenum 701 and multiple heat exchange tube sections 620' (only one of which is shown). A plurality of fins 630 are attached to the horizontally-oriented heat exchange tube sections 620' for facilitating transfer of heat from air passing across the air-to-liquid heat exchanger to coolant flowing through the heat exchange tube sections 620'. In the embodiment illustrated, an actively controlled, adjustable flow restrictor 1700 is illustrated, such as described above in connection with the cooling apparatus of FIGS. 8-10. In this embodiment, the actively controlled, adjustable flow restrictor 1700 is disposed at the coolant channel inlet 1401 of heat exchange tube section 620', and includes an adjustable orifice of varying opening size which is actively controlled (e.g., by a rack-level control unit (not shown)). In addition, pressure and temperature sensors 1710 and 1720 are provided at the coolant channel inlet 1401 and coolant channel outlet 1411, respectively, of heat exchange tube section 620'. The rack-level control unit employs the sensed pressure and temperature readings for system coolant passing through the multiple heat exchange tube sections in determining whether to increase or decrease orifice opening sizes within the actively controlled, adjustable flow restrictors associated with the multiple heat exchange tube sections, and thereby tailor coolant flow resistance through the heat exchange tube sections. This tailoring of coolant flow is controlled to enhance heat transfer within the multiple heat exchange tube sections, for example, by ensuring that latent heat transfer to refrigerant occurs within each heat exchange tube section.

Figure 18:
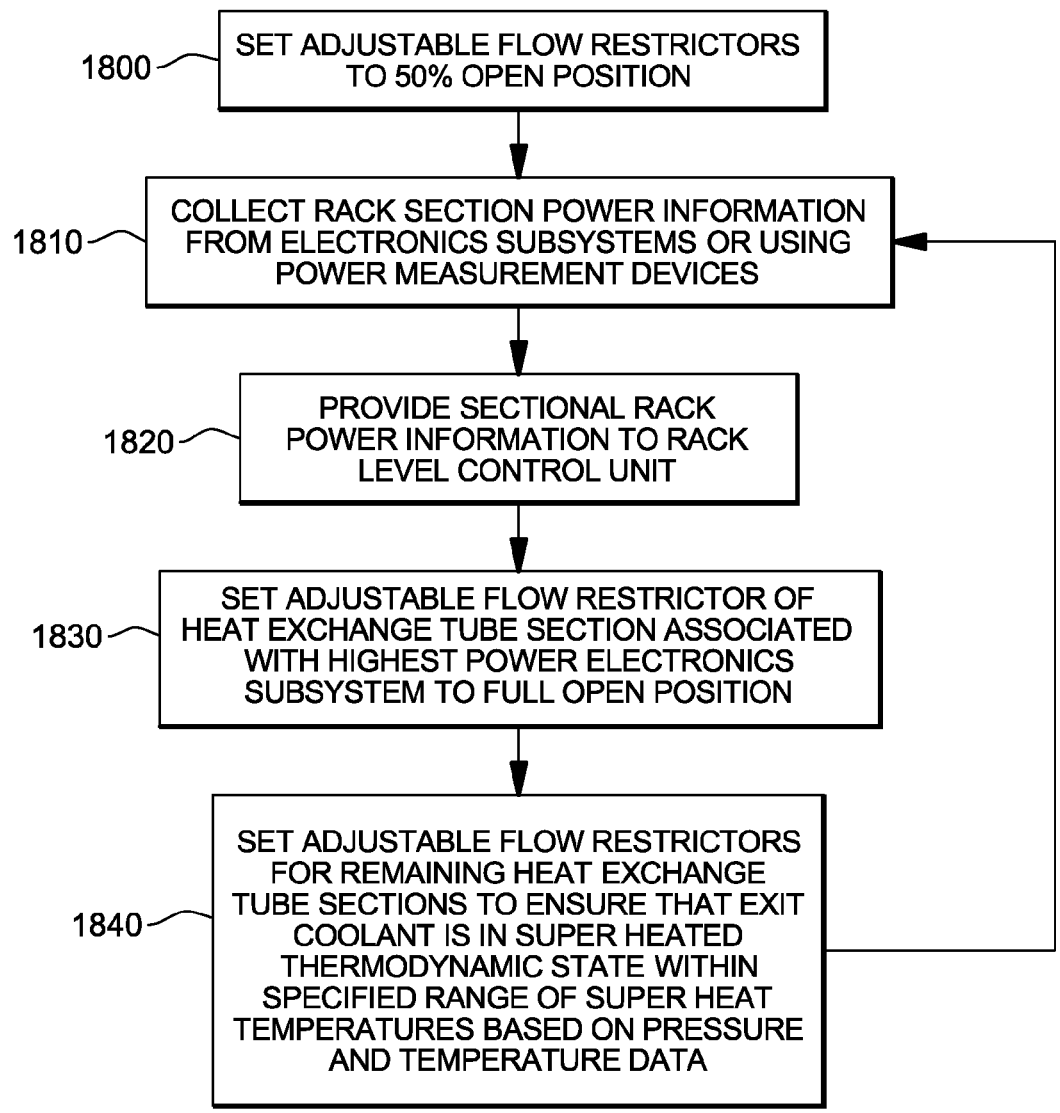
FIG. 18 depicts one embodiment of logic for controlling coolant flow resistance through multiple heat exchange tube sections of a heat exchange assembly associated with an electronics rack to enhance heat transfer within the multiple heat exchange tube sections of the heat exchange assembly, in accordance with an aspect of the present invention.

FIG. 18 illustrates one embodiment of logic for controlling adjustable flow restrictors in a heat exchange assembly, such as depicted in FIG. 17. Initially, each adjustable flow restrictor (i.e., each tube section level flow restrictor within the heat exchanger) is set to 50% open position 1800, and the power consumption of the rack unit subsystems in opposing relation to the individual heat exchange tube sections is collected from the corresponding subsystems or is ascertained using power measurement devices 1810. This sectional rack power information is then employed by a rack-level control unit 1820 (for example). The logic sets the adjustable flow restrictor associated with the heat exchange tube section that is in opposing relation to the highest power consuming subsystem in the electronics rack to a full open position 1830. This is the heat exchange tube section which will experience the highest exhaust airflow temperature from the electronics rack. Next, the logic sets the adjustable flow restrictors for the remaining heat exchange tube sections to ensure that the exhausting system coolant from each heat exchange tube section is in a super-heated thermodynamic state within a specific range of super-heat temperatures, based on the sensed pressure and temperature data for the individual heat exchange tube sections 1840, and then returns to collect updated rack subsection power consumption information 1810.

Note that in the embodiment of FIG. 17, pressure and temperature sensor 1720 is disposed at the coolant channel outlet 1411 of heat exchange tube section 620' to measure the temperature and pressure of the coolant exiting the heat exchange tube section. From this data, the thermodynamic state of the coolant can be determined within each section. It is also desired that the coolant exiting each of the parallel-coupled heat exchange tube sections be slightly super-heated (i.e., above saturation temperature with no liquid content). Measuring temperature and pressure at the outlet of the heat exchange tube sections provides a mechanism for determining if the coolant exiting the heat exchange tube sections is super-heated. Pressure-enthalpy (P-H) diagrams for R-134a refrigerant are available in the art, which indicate the regions in which the coolant is saturated, as well as super-heated, by the variables of pressure, temperature and enthalpy. Pressure and temperature measurement of the coolant provides sufficient data to determine if the coolant is saturated or super-heated. The pressure and temperature values measured will be input to a coolant-dependant algorithm (defined by the P-H diagram/properties of the coolant), which determines if the coolant is super-heated. If the coolant is not super-heated (i.e., coolant is sub-cooled or saturated), then the adjustable orifice opening size will be modulated until the exiting coolant is super-heated. This ensures that all coolant exiting each heat exchange tube section has utilized its latent cooling effect and is 100% vapor in the return plenum. The modulation of the adjustable orifice opening size serves to increase the flow resistance in a single heat exchange tube section, while redirecting coolant flow to ensure sufficient vaporization and cooling in all sections of the rear door heat exchanger. If the heat load across a specific heat exchange tube section which has a low coolant flow suddenly increases, then the extent of super-heat will be determined using the same pressure and temperature sensor information. If the degree of super-heat is too much, then the control algorithm opens the valve, thereby reducing the flow resistance of the heat exchange tube section, and thus attracting more coolant flow and reducing the degree of super-heat. Therefore, the controller determines the thermodynamic state using the pressure and temperature data, manipulates the valve position to force a super-heated condition, and also forces the degree of super-heat so as to be within a specific temperature differential in excess of the saturated condition. For example, if for a specific design, the saturated temperature of the refrigerant flow is 18° C., then the valve may be controlled to force the exhaust refrigerant vapor to be at 20° C.

Further details and variations of liquid-based cooling apparatuses and methods for cooling electronics systems and/or electronics racks are disclosed in co-filed U.S. patent application Ser. No. 12/556,019, entitled "Pressure Control Unit and Method Facilitating Single-Phase Heat Transfer in a Cooling System", published Mar. 10, 2011, as U.S. Patent Publication No. 2011/0058637 A1; co-filed U.S. patent application Ser. No. 12/556,031, entitled "Control of System Coolant to Facilitate Two-Phase Heat Transfer in a Multi-Evaporator Cooling System", published Mar. 10, 2011, as U.S. Patent Publication No. 2011/0056225 A1; co-filed U.S. patent application Ser. No. 12/056,053, entitled "System and Method for Facilitating Parallel Cooling of Liquid-Cooled Electronics Racks", published Mar. 10, 2011, as U.S. Patent Publication No. 2011/0056674 A1; and co-filed U.S. patent application Ser. No. 12/556,066 entitled "Cooling System and Method Minimizing Power Consumption in Cooling Liquid-Cooled Electronics Racks", published Mar. 10, 2011, as U.S. Patent Publication No. 2011/0060470 A1, the entirety of each of which is hereby incorporated herein by reference.

As will be appreciated by one skilled in the art, aspects of the controller described above may be embodied as a system, method or computer program product. Accordingly, aspects of the controller may take the form of an entirely hardware embodiment, an entirely software embodiment (including firmware, resident software, micro-code, etc.) or an embodiment combining software and hardware aspects that may all generally be referred to herein as a "circuit", "module" or "system". Furthermore, aspects of the controller may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus or device.

Program code embodied on a computer readable medium may be transmitted using an appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language, such as Java, Smalltalk, C++ or the like, and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Although embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of cooling a plurality of electronics racks, each electronics rack comprising a heat exchange assembly, the method comprising:
   obtaining a cooling apparatus comprising:
      a plurality of coolant supply lines and a plurality of coolant return lines coupled in fluid communication between a coolant distribution unit and the heat exchange assemblies of the plurality of electronics racks, the coolant distribution unit supplying cooled system coolant for the heat exchange assemblies, wherein when operational, system coolant circulates in a closed loop between the coolant distribution unit and the heat exchange assemblies via, at least in part, the plurality of coolant supply lines and the plurality of coolant return lines; and
      a plurality of rack flow restrictors associated with at least one of the plurality of coolant supply lines, the plurality of coolant return lines, or the heat exchange assemblies of the plurality of electronics racks, each rack flow restrictor being associated with a respective coolant supply line of the plurality of coolant supply lines, a respective coolant return line of the plurality of coolant return lines, or a respective heat exchange assembly of the heat exchange assembles, for tailoring coolant flow resistance through the heat exchange assembly of the respective electronics rack, and wherein the plurality of rack flow restrictors tailor coolant flow resistance through at least one of the plurality of coolant supply lines, the plurality of coolant return lines, or the heat exchange assemblies to enhance overall heat transfer through the heat exchange assemblies of the plurality of electronics racks; and
   cooling the plurality of electronics racks, the cooling comprising:
      collecting rack power utilization data for each electronics rack of the plurality of electronics racks;
      summing the rack power utilizations of the plurality of electronics racks and determining a total coolant flow required to cool the plurality of electronics racks, and based on the total coolant flow required, automatically setting a rate of cooled system coolant supplied by the coolant distribution unit;
      determining the highest power utilizing electronics rack of the plurality of electronics racks and automatically setting the rack flow restrictor associated therewith to full open position;
      ascertaining coolant pressure and temperature information at the heat exchange assemblies of the plurality of electronics racks; and
      setting rack flow restrictors associated with the remaining electronics racks of the plurality of electronics racks to ensure coolant exhausting from the heat exchange assemblies of the remaining electronics racks is in a super heated vapor state within a specified range of superheated temperatures based on the collected coolant pressure and temperature information.

2. The method of claim 1, wherein setting the rack flow restrictors tailors a coolant flow distribution differential through the heat exchange assemblies of the remaining electronics racks, the coolant flow distribution differential being tailored based on rack-level power consumption of the remaining electronics racks.

3. The method of claim 1, wherein setting the rack flow restrictors defines different coolant flow resistances through at least two heat exchange assemblies of the remaining electronics racks.

4. The method of claim 1, wherein at least one rack flow restrictor of the plurality of rack flow restrictors comprises at least one adjustable rack flow restrictor, each adjustable rack flow restrictor of the at least one adjustable rack flow restrictor comprising a dynamically adjustable orifice opening size for dynamically adjusting system coolant flow resistance through the respective heat exchange assembly.

5. The method of claim 1, wherein the cooling apparatus comprises coolant pressure and temperature sensors associated with at least one of the plurality of coolant supply lines, the plurality of coolant return lines, or the heat exchange assemblies of the plurality of electronics racks for sensing the pressure and temperature of system coolant passing therethrough.

6. The method of claim 1, wherein the cooling apparatus comprises a controller, the controller automatically facilitating performing the cooling, including the collecting, the summarizing, the determining, the ascertaining and the setting.

7. A method of cooling an electronics rack comprising a heat exchange assembly with a plurality of heat exchange tube sections, the method comprising:

providing a cooling apparatus comprising:

multiple temperature sensors and multiple pressure sensors, each associated with a respective heat exchange tube section of the heat exchange assembly for monitoring temperature and pressure of coolant passing therethrough;

multiple flow restrictors associated with the plurality of heat exchange tube sections, each flow restrictor of the multiple flow restrictors being associated with a respective heat exchange tube section of the plurality of heat exchange tube sections for tailoring coolant flow resistance through the respective heat exchange tube section based, at least in part, on pressure and temperature of coolant passing through the respective heat exchange tube section; and a rack control unit configured to control coolant flow through the multiple heat exchange tube sections of the heat exchange assembly, the rack control unit being configured to:

collect rack section power utilization data for a plurality of rack sections of the electronics rack, each rack section having an associated heat exchange tube section of the plurality of heat exchange tube sections;

determine a highest power utilizing rack section within the electronics rack and set the flow restrictor of the associated heat exchange tube section of that rack section to full open position;

set flow restrictors associated with the remaining heat exchange tube sections of the heat exchange assembly to ensure coolant exhausting from the remaining heat exchange tube sections is in superheated vapor state within a specified range of superheated temperatures based on the collected coolant pressures and temperatures.

8. The method of claim 7, wherein the controller is further configured to initially set the flow restrictors to a common initial pre-defined open position.

9. The method of claim 8, wherein the common pre-defined open position is 50% open.

10. The method of claim 7, further comprising subsequently repeating the collecting, the determining and the setting.

* * * * *